(12) United States Patent
Bao et al.

(10) Patent No.: US 9,059,170 B2
(45) Date of Patent: Jun. 16, 2015

(54) ELECTRONIC FUSE HAVING A DAMAGED REGION

(71) Applicant: International Business Machines Corporation, Armonk, NY (US)

(72) Inventors: Junjing Bao, Cedar Grove, NJ (US); Griselda Bonilla, Fishkill, NY (US); Samuel S. Choi, Beacon, NY (US); Ronald G. Filippi, Wappingers Falls, NY (US); Wai-Kin Li, Beacon, NY (US); Erdem Kaltalioglu, Newburgh, NY (US); Naftali E. Lustig, Croton on Hudson, NY (US); Andrew H. Simon, Fishkill, NY (US); Ping-Chuan Wang, Hopewell Junction, NY (US); Lijuan Zhang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 13/760,488

(22) Filed: Feb. 6, 2013

(65) Prior Publication Data
US 2014/0217612 A1   Aug. 7, 2014

(51) Int. Cl.
*H01L 23/525*     (2006.01)
*H01L 23/532*     (2006.01)

(52) U.S. Cl.
CPC ....... *H01L 23/5256* (2013.01); *H01L 23/53223* (2013.01); *H01L 23/53238* (2013.01); *H01L 23/53266* (2013.01); *H01L 23/53295* (2013.01); *H01L 2924/0002* (2013.01)

(58) Field of Classification Search
CPC ............ H01L 23/5256; H01L 23/5226; H01L 23/53238; H01L 23/53266; H01L 23/53223; H01L 23/53295; H01L 2924/0002; H01L 23/5329; H01L 23/53228; H01L 23/53233; H01L 23/53257; H01L 23/53261; H01L 23/53214; H01L 23/53219
USPC .......................... 257/209, 529, 775; 438/601
See application file for complete search history.

(56) References Cited

U.S. PATENT DOCUMENTS

| | | |
|---|---|---|
| 5,420,456 A | 5/1995 | Galbi et al. |
| 5,608,257 A | 3/1997 | Lee et al. |

(Continued)

FOREIGN PATENT DOCUMENTS

| | | |
|---|---|---|
| JP | 2010161287 A | 7/2010 |
| WO | 2014123620 A1 | 8/2014 |

OTHER PUBLICATIONS

International Search Report and Written Opinion, PCT US2013/073775, Mar. 25, 2014.

*Primary Examiner* — Khiem D Nguyen
*Assistant Examiner* — Pauline Vu
(74) *Attorney, Agent, or Firm* — L. Jeffrey Kelly; Catherine Ivers

(57) ABSTRACT

An electronic fuse structure including an $M_x$ level comprising an $M_x$ metal, and an $M_{x+1}$ level above the $M_x$ level, the $M_{x+1}$ level including an $M_{x+1}$ metal and a via electrically connecting the $M_x$ metal to the $M_{x+1}$ metal in a vertical orientation, where the $M_{x+1}$ metal comprises a thick portion and a thin portion, and where the $M_x$ metal, the $M_{x+1}$ metal, and the via are substantially filled with a conductive material.

24 Claims, 16 Drawing Sheets

(56) References Cited

U.S. PATENT DOCUMENTS

| | | |
|---|---|---|
| 6,225,652 B1 * | 5/2001 | Devanney .................. 257/209 |
| 6,242,789 B1 * | 6/2001 | Weber et al. ................ 257/529 |
| 6,242,790 B1 * | 6/2001 | Tsui et al. .................. 257/529 |
| 6,252,292 B1 | 6/2001 | Brintzinger et al. |
| 6,337,507 B1 | 1/2002 | Bohr et al. |
| 6,368,902 B1 | 4/2002 | Kothandaraman et al. |
| 6,444,503 B1 | 9/2002 | Yu |
| 6,497,805 B2 | 12/2002 | Lake et al. |
| 6,521,971 B2 | 2/2003 | Tsai |
| 6,555,458 B1 | 4/2003 | Yu |
| 6,737,345 B1 | 5/2004 | Lin et al. |
| 6,746,947 B2 | 6/2004 | Daubenspeck et al. |
| 6,933,591 B1 | 8/2005 | Sidhu et al. |
| 7,153,712 B1 | 12/2006 | Sidhu et al. |
| 7,205,588 B2 | 4/2007 | Jeng et al. |
| 7,227,207 B2 | 6/2007 | Park et al. |
| 7,651,893 B2 | 1/2010 | Chen et al. |
| 7,745,266 B2 | 6/2010 | Bae |
| 7,968,967 B2 | 6/2011 | Wang et al. |
| 8,076,760 B2 | 12/2011 | Manning |
| 8,184,465 B2 | 5/2012 | Tonti et al. |
| 8,232,190 B2 | 7/2012 | Bernstein et al. |
| 2001/0031516 A1 | 10/2001 | Bouldin et al. |
| 2003/0168714 A1 * | 9/2003 | Daubenspeck et al. ........ 257/529 |
| 2004/0238964 A1 * | 12/2004 | Kawano et al. .............. 257/758 |
| 2005/0189612 A1 * | 9/2005 | Hung et al. .................. 257/529 |
| 2007/0120232 A1 * | 5/2007 | Greco et al. ................. 257/665 |
| 2007/0284693 A1 | 12/2007 | Kim et al. |
| 2008/0308900 A1 * | 12/2008 | Kim et al. ................... 257/529 |
| 2010/0038747 A1 | 2/2010 | Chanda et al. |
| 2010/0118636 A1 | 5/2010 | Chanda et al. |
| 2010/0176483 A1 * | 7/2010 | Iguchi ......................... 257/529 |
| 2010/0213569 A1 * | 8/2010 | Wu et al. ..................... 257/529 |
| 2011/0024873 A1 | 2/2011 | Lee |
| 2011/0133307 A1 * | 6/2011 | Daubenspeck et al. ........ 257/529 |
| 2011/0156858 A1 | 6/2011 | Poppe et al. |
| 2012/0126363 A1 | 5/2012 | Wang et al. |
| 2012/0146179 A1 | 6/2012 | Lee et al. |
| 2012/0249159 A1 * | 10/2012 | Filippi et al. ................ 324/538 |
| 2012/0306048 A1 * | 12/2012 | Li et al. ...................... 257/529 |
| 2013/0176073 A1 * | 7/2013 | Bao et al. .................... 327/525 |
| 2013/0214894 A1 * | 8/2013 | Bonilla et al. ............... 337/290 |

* cited by examiner

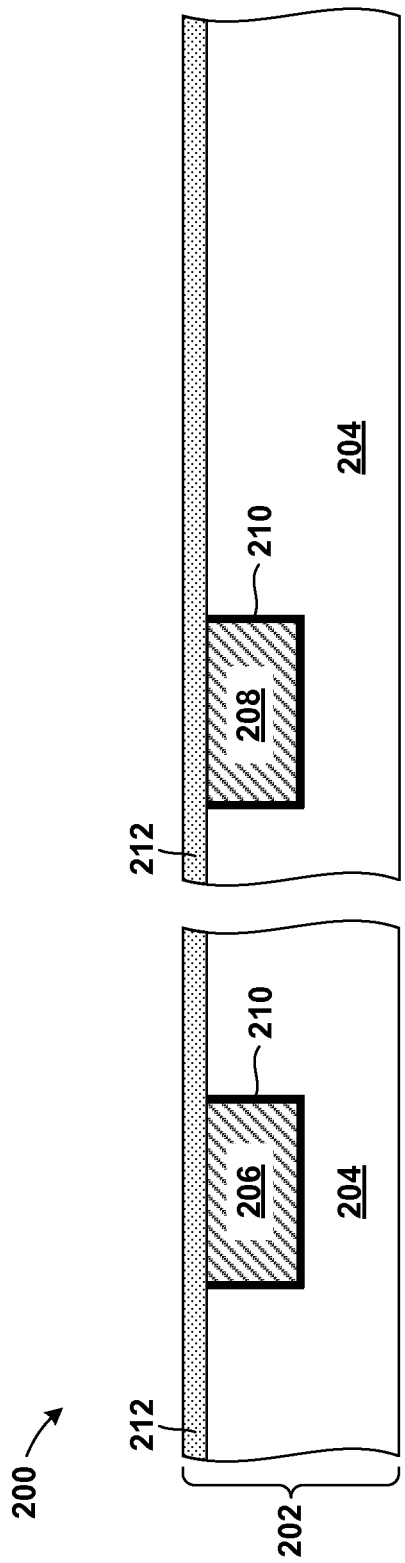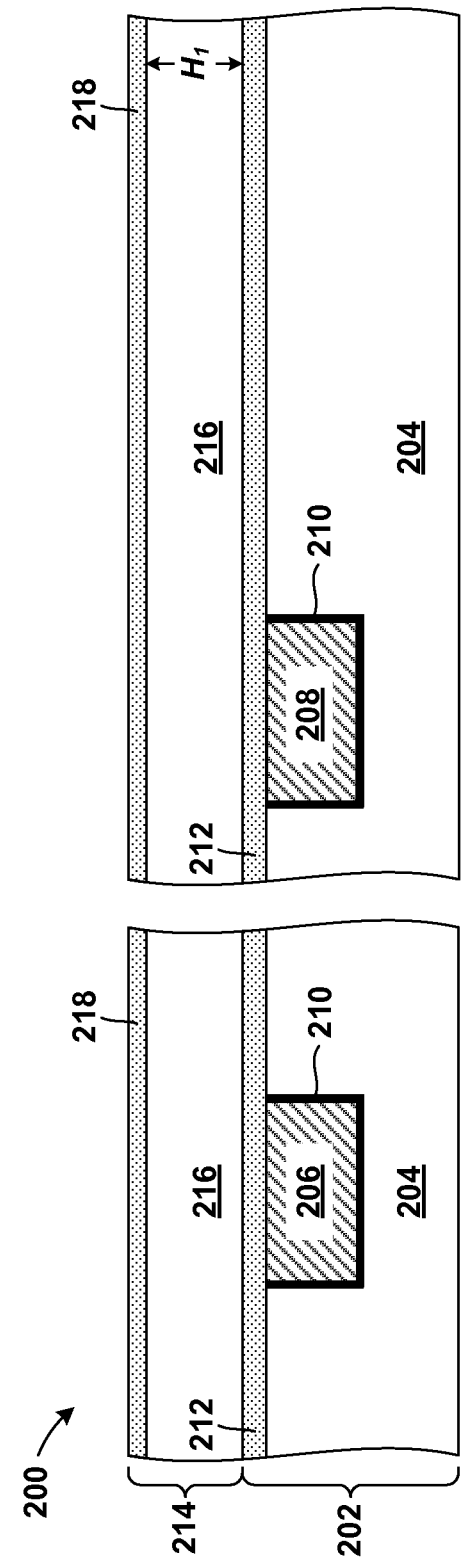

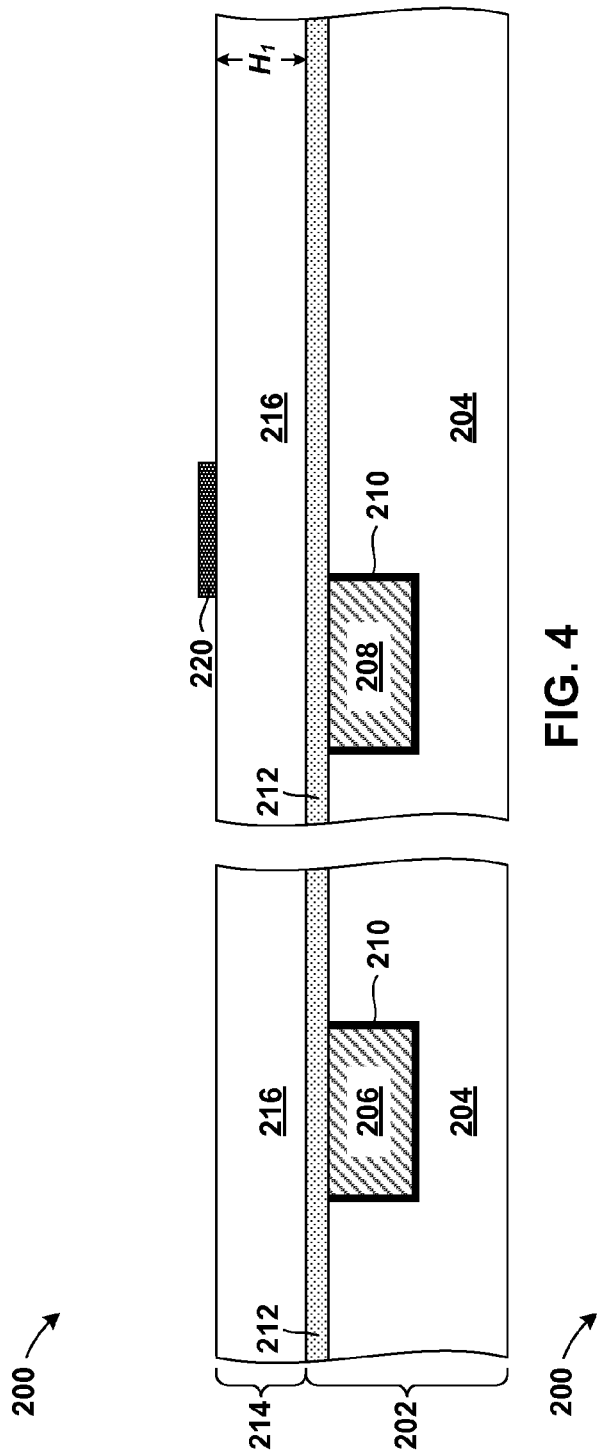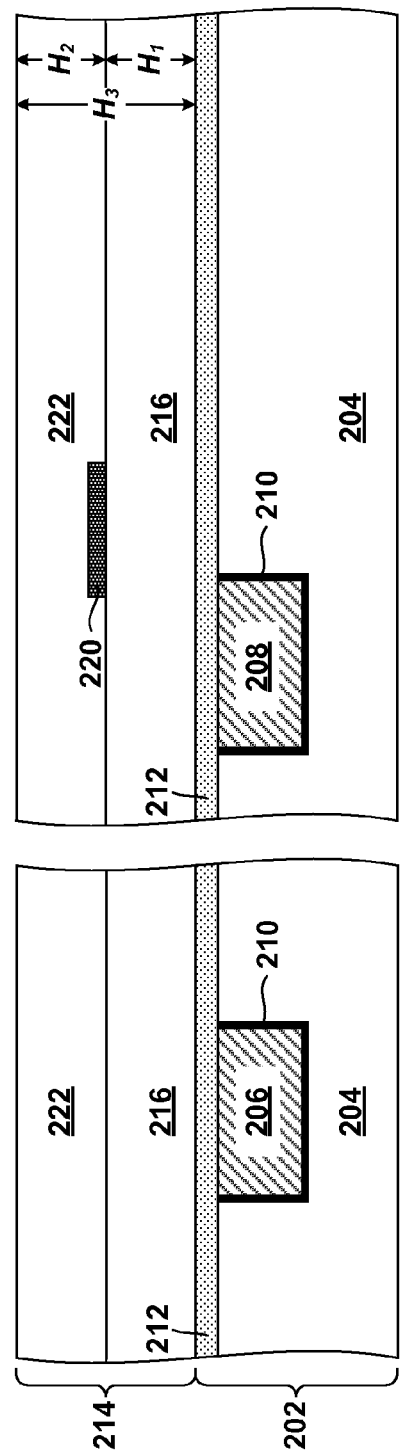

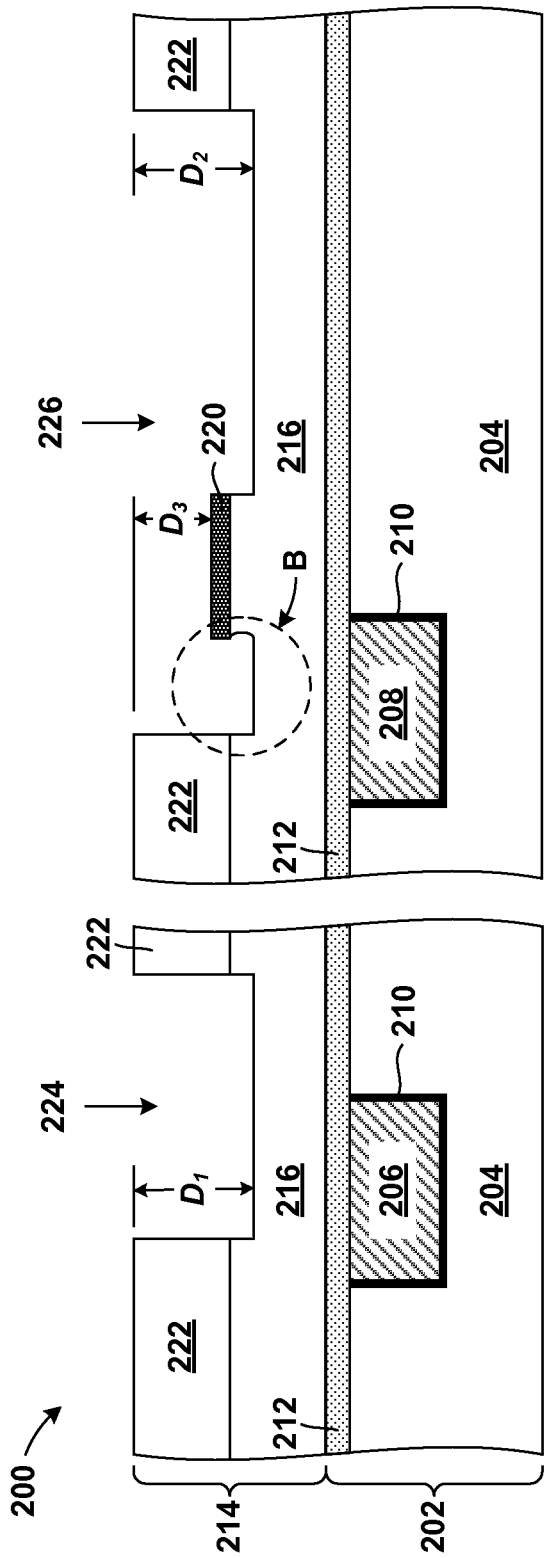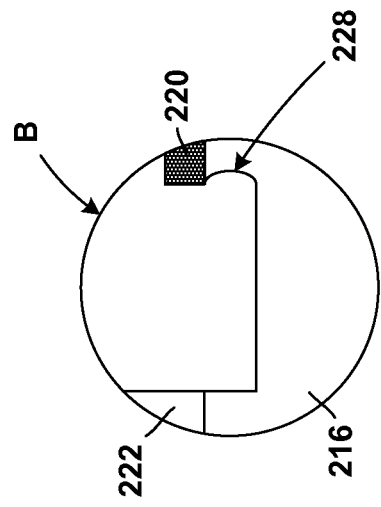
FIG. 6
FIG. 6A

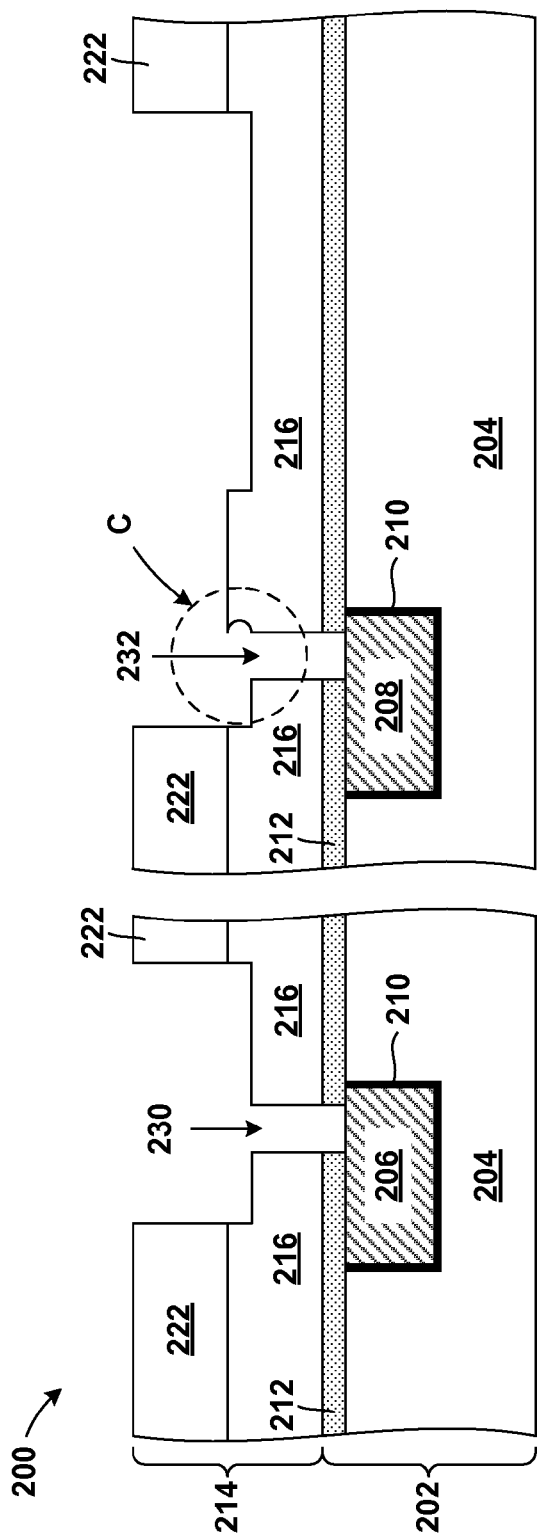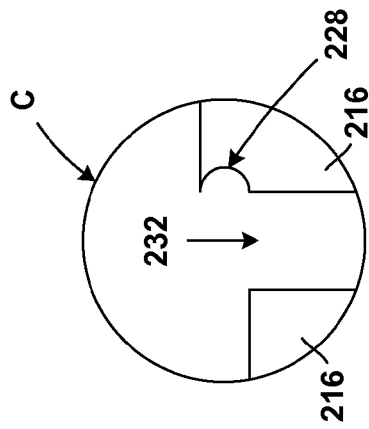
FIG. 7
FIG. 7A

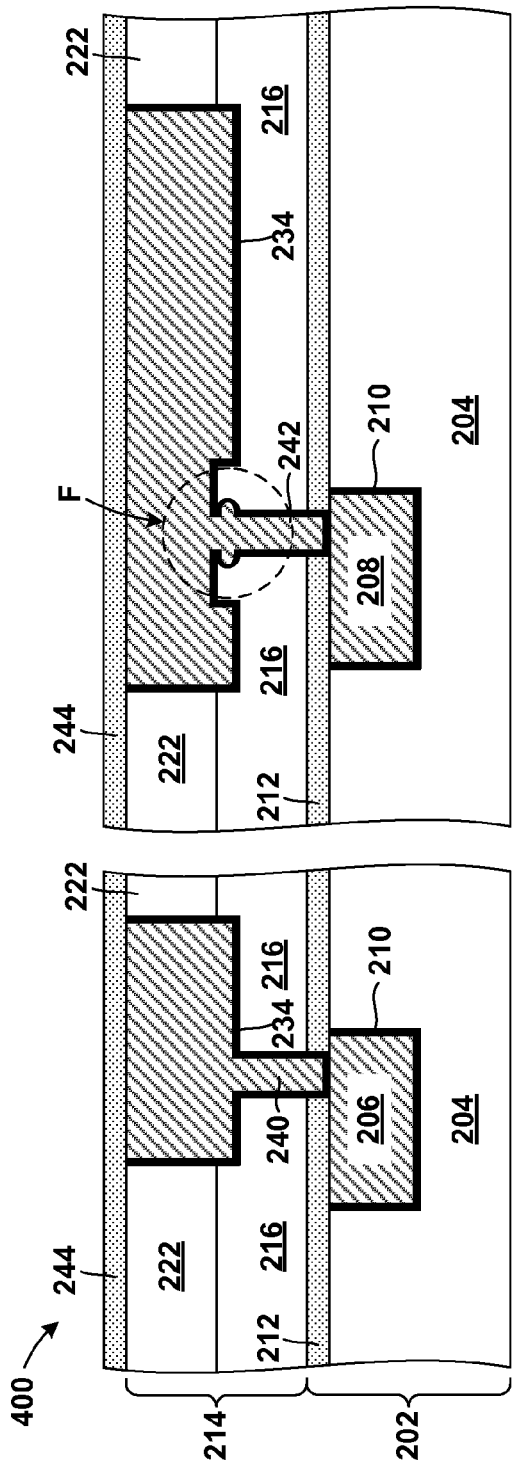
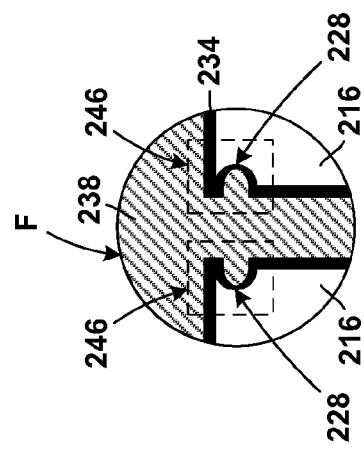
FIG. 11
FIG. 11A

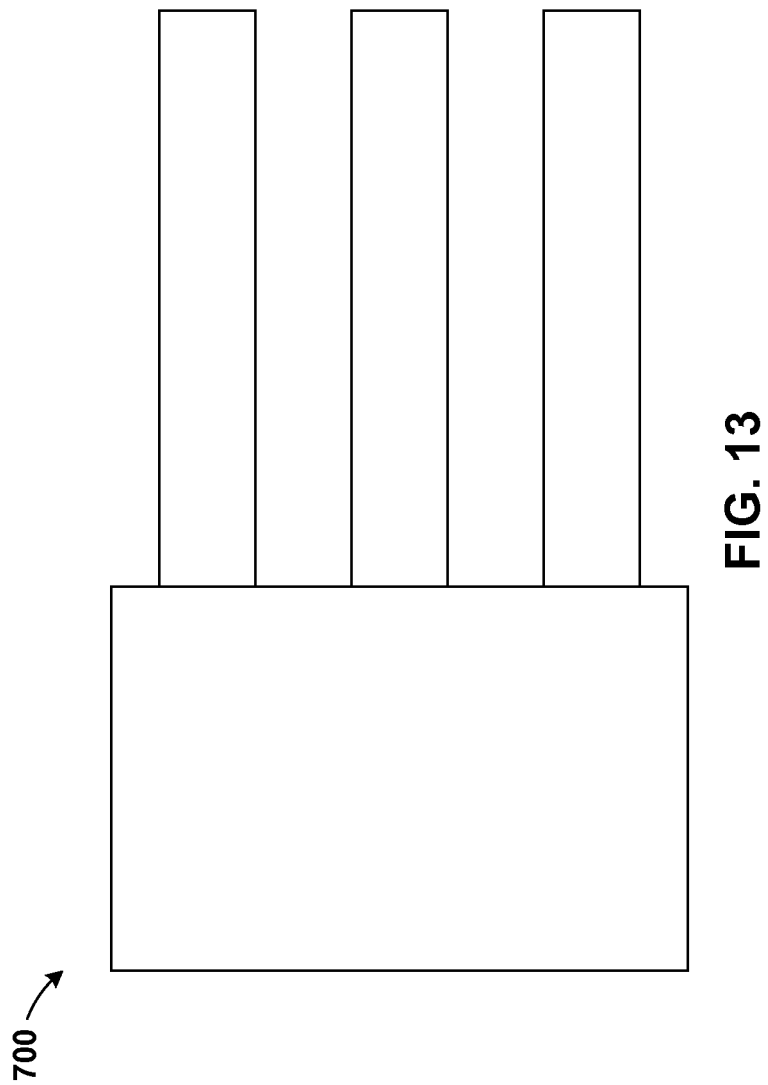

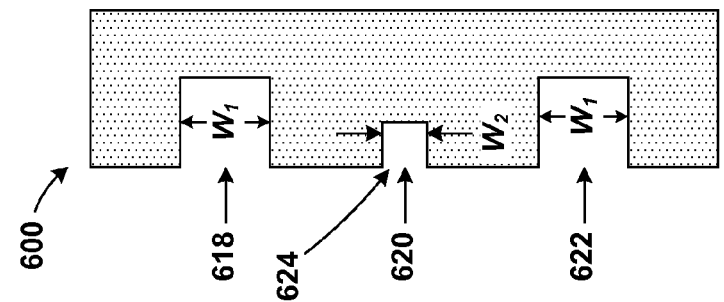
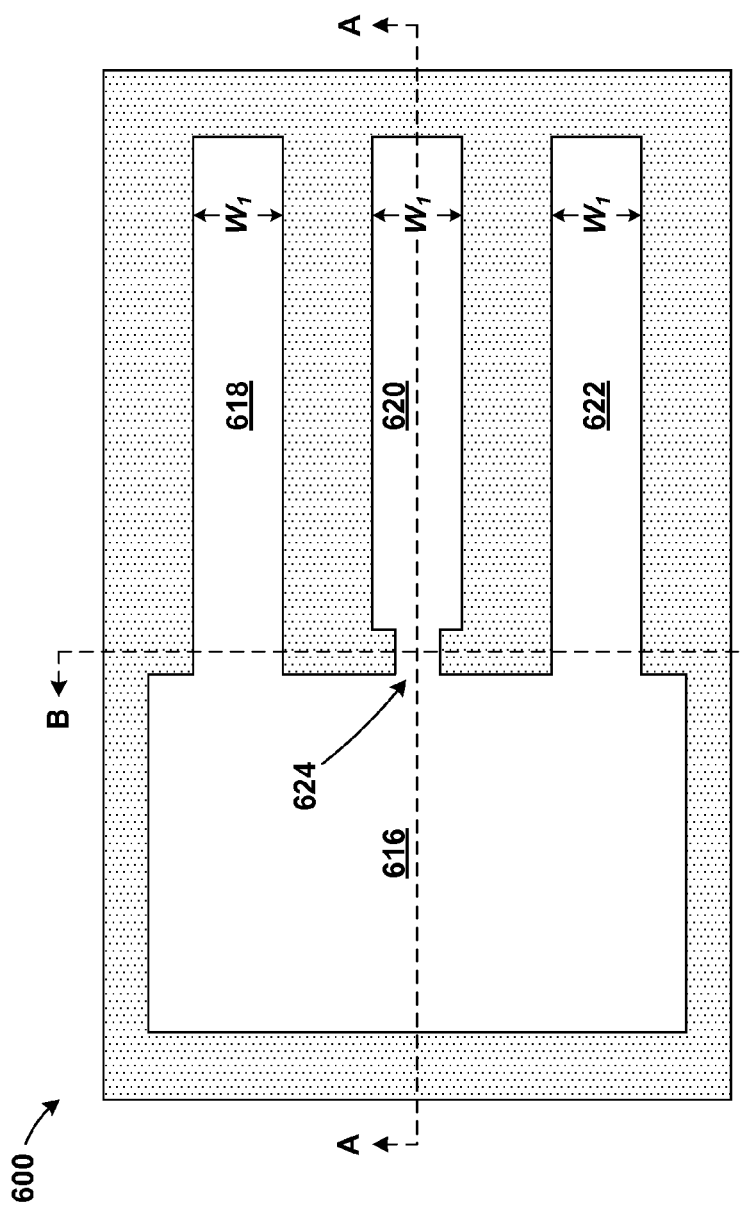
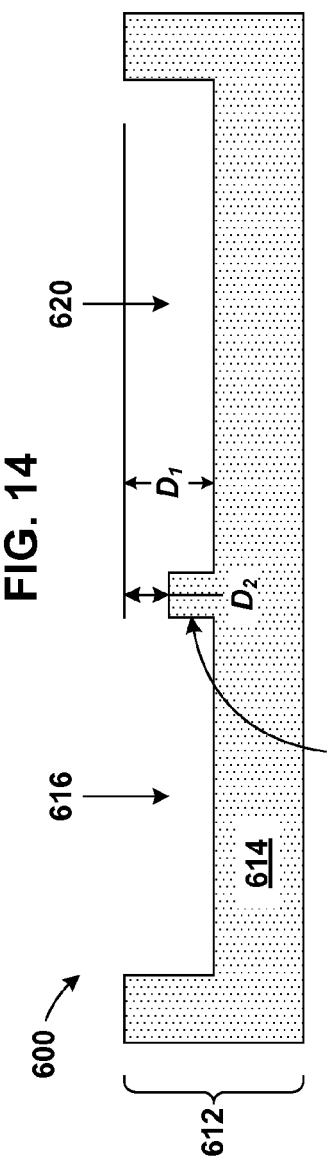

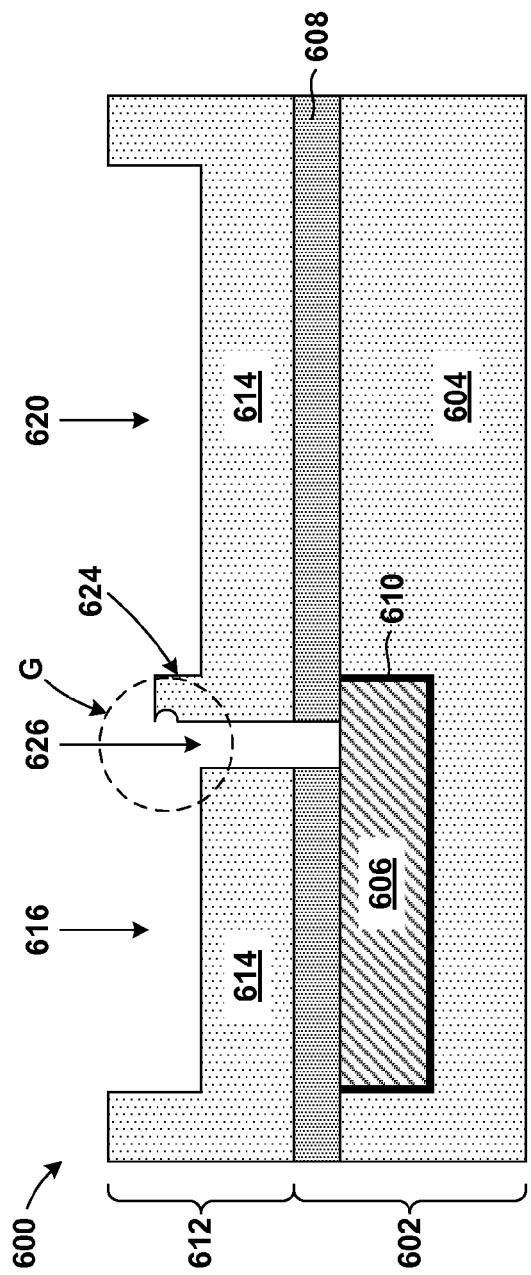
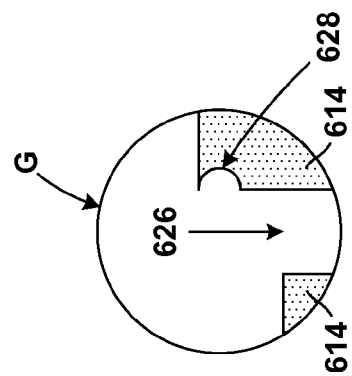
FIG. 17
FIG. 17A

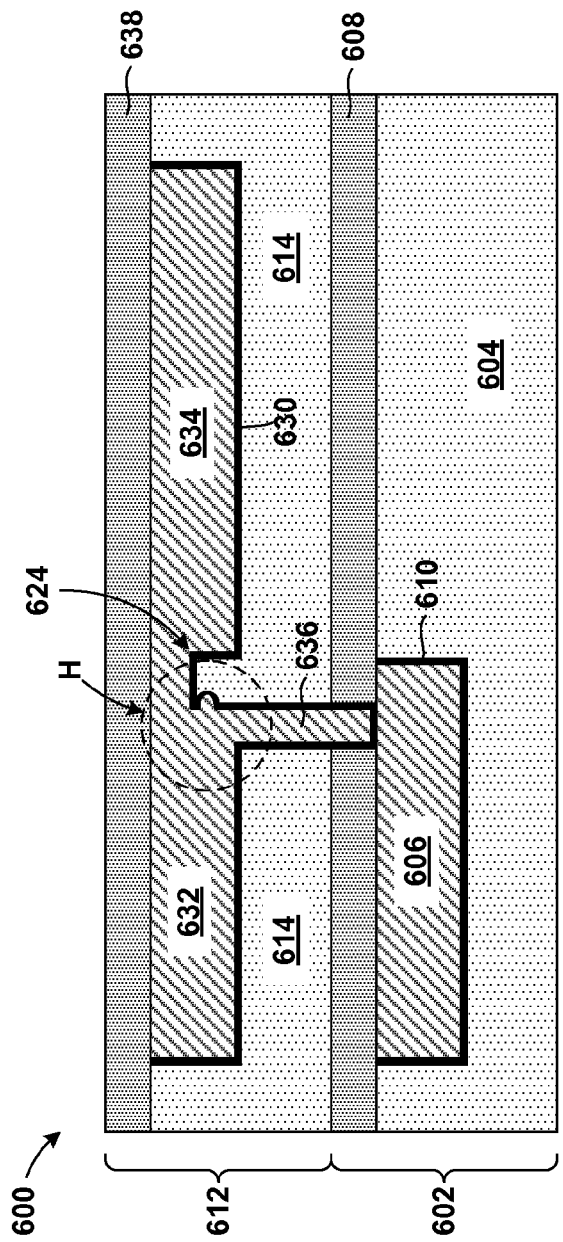
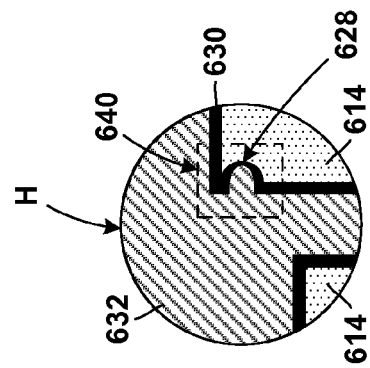
FIG. 18
FIG. 18A

ELECTRONIC FUSE HAVING A DAMAGED REGION

BACKGROUND

1. Field of the Invention

The present invention relates generally to semiconductors, and, more particularly, to electronic fuse interconnect structures.

2. Background of Invention

A fuse is a structure that is blown in accordance with a suitable electrical current. For example, an electrical current is provided through the fuse to eventually cause the fuse to blow and create an open circuit. Programming refers to intentionally blowing a fuse and creating the open circuit. In integrated circuitry memory devices, fuses can be used for activating redundancy in memory chips and for programming functions and codes in logic chips. Specifically, dynamic random access memory (DRAM) and static random access memory (SRAM) may employ fuses for such purposes.

Electronic fuses (e-fuses) can also be used to prevent decreased chip yield caused by random defects generated in the manufacturing process. Moreover, e-fuses provide for future customization of a standardized chip design. For example, e-fuses may provide for a variety of voltage options, packaging pin out options, or any other options desired by the manufacturer to be employed prior to the final processing. These customization possibilities make it easier to use one basic design for several different end products and help increase chip yield.

Some e-fuses take advantage of electromigration effects to blow and create the open circuit. For example, electromigration can be defined as the transport of material caused by the gradual movement of ions in a conductor due to the momentum transfer between conducting electrons and diffusing metal atoms. In e-fuses that take advantage of electromigration effect, such transport of material caused by the gradual movement of ions can produce voids which cause the e-fuse to blow and create the open circuit.

However, in a typical e-fuse electromigration may cause unpredictable voids, thus potentially creating the open circuit in undesirable locations. Furthermore, typical e-fuse programming may require high programming currents and long programming times. Such programming currents and times may result in unpredictable void formation during programming which may negatively affect other circuits adjacent to the e-fuse. Therefore, it may be desirable to program an e-fuse with lower programming currents and shorter programming times. In addition, predictable and repeatable void formation may also be preferred.

Accordingly, there exists a need in the art to overcome the deficiencies and limitations described hereinabove.

SUMMARY

According to one embodiment of the present invention, an electronic fuse structure is provided. The electronic fuse structure may include an $M_x$ level including an $M_x$ metal, and an $M_{+1}$ level above the $M_x$ level, the $M_{x+1}$ level including an $M_{x+1}$ metal and a via electrically connecting the $M_x$ metal to the $M_{x+1}$ metal in a vertical orientation, where the $M_{x+1}$ metal includes a thick portion and a thin portion, and where the $M_x$ metal, the $M_{x+1}$ metal, and the via are substantially filled with a conductive material.

According another exemplary embodiment, a method of forming an electronic fuse is provided. The method may include forming a first $M_{x+1}$ dielectric above an $M_x$ level, forming an intermediate dielectric above a fuse region, and forming a second $M_{x+1}$ dielectric above the first $M_{x+1}$ dielectric and the intermediate dielectric, where the first $M_{x+1}$ dielectric, the second $M_{x+1}$ dielectric form an $M_{x+1}$ level. The method mat further include forming a trench in the $M_{x+1}$ level above the fuse region, where the intermediate dielectric is resistant to an etching technique used to form the trench causing the trench to have a thick portion and a thin portion, forming a via opening in the trench, where the via opening extends from a bottom surface of the trench to a top surface of an $M_x$ metal located in the $M_x$ level, and removing the intermediate dielectric.

According to another embodiment of the present invention, an electronic fuse structure is provided. The electronic fuse structure may include a first $M_{x+1}$ metal a second $M_{x+1}$ metal, a third $M_{x+1}$ metal in contact with the first $M_{x+1}$ metal, where the third $M_{x+1}$ metal includes a necked region, and a fourth $M_{x+1}$ metal, where the second $M_{x+1}$ metal is adjacent to one side of the third $M_{x+1}$ metal, and the fourth $M_{x+1}$ metal is adjacent to an opposite side of the third $M_{x+1}$ metal.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which:

FIGS. 2-8 illustrate the steps of a method of forming an e-fuse according to an exemplary embodiment.

FIG. 2 depicts an $M_x$ level having a first $M_x$ metal, a second $M_x$ metal, and an $M_x$ cap dielectric according to an exemplary embodiment.

FIG. 3 depicts the formation of a first $M_{x+1}$ dielectric and an intermediate dielectric according to an exemplary embodiment.

FIG. 4 depicts the removal of a portion of the intermediate dielectric according to an exemplary embodiment.

FIG. 5 depicts the formation of a second $M_{x+1}$ dielectric according to an exemplary embodiment.

FIG. 6 depicts the formation of a fuse trench and a non-fuse trench according to an exemplary embodiment.

FIG. 6A depicts a section view, section B, of FIG. 6.

FIG. 7 depicts the formation of a first via opening and a second via opening according to an exemplary embodiment.

FIG. 7A depicts a section view, section C, of FIG. 7.

FIG. 8 depicts the final e-fuse structure according to an exemplary embodiment.

FIG. 11 depicts the final e-fuse structure according to another exemplary embodiment.

FIG. 11A depicts a section view, section F, of FIG. 11.

FIGS. 12-18 illustrate the steps of a method of forming an e-fuse according to an exemplary embodiment.

FIG. 12 depicts an $M_x$ level having an $M_x$ metal, and an $M_x$ cap dielectric according to an exemplary embodiment.

FIG. 13 depicts a design layout according to an exemplary embodiment.

FIG. 14 depicts an $M_{x+1}$ dielectric after patterning the design layout according to an exemplary embodiment.

FIG. 15 depicts a cross section view, section A-A, of FIG. 14.

FIG. 16 depicts a cross section view, section B-B, of FIG. 14.

FIG. 17 depicts the formation of a via opening according to an exemplary embodiment.

FIG. 17A depicts a section view, section G, of FIG. 17.

FIG. 18 depicts the final e-fuse structure according to another exemplary embodiment.

FIG. 18A depicts a section view, section H, of FIG. 18.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The invention relates generally to an e-fuse structure, and more particularly, an e-fuse structure having a defective region. The e-fuse structure may include the defective region adjacent to an intersection between a via and a thin portion of an $M_{x+1}$ metal. In some cases, the e-fuse structure may include more than one defective region. The defective regions, may in some cases, be defined by poor liner coverage and small voids located in the conductive material.

Advantageously, the formation of the e-fuse structure of the present invention can be implemented in the back-end-of-line (BEOL), and is compatible with current process flows. The BEOL may be distinguished from FEOL in that semiconductor devices, for example transistors, may be fabricated in the FEOL while the connections to and between those semiconductor devices may be formed in the BEOL. The present invention thus allows the e-fuse to be fabricated during normal interconnect process flows, thus advantageously reducing processing costs for manufacturing e-fuses which are normally fabricated in different process flows.

More specifically, multilayer electronic components comprise multiple layers of a dielectric material having metallization on each layer in the form of vias, pads, straps connecting pads to vias, and wiring. Vias or other openings in the dielectric layer extend from one layer to another layer. These openings are filled with a conductive material and electrically connect the metallization of one layer to the metallization of another layer and provide for the high density electronic component devices now used in industry. The metallization of each dielectric layer may be formed using a filling technique such as electroplating, electroless plating, chemical vapor deposition, physical vapor deposition or a combination of methods. The metallization and dielectric layer may be capped with a cap dielectric, which may be, for example, nitride. In the present case, the fuse line may be referred to as the metallization of a dielectric layer as described above.

Figure 1:
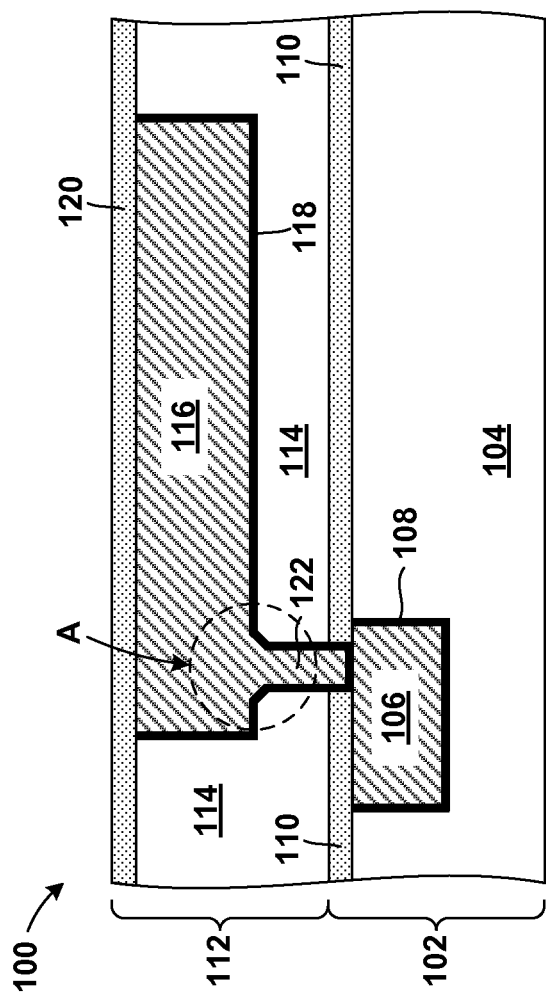
FIG. 1 depicts a cross-sectional view of two interconnect levels connected by a via according to the prior art.

By way of example FIG. 1 illustrates a structure 100 having a typical interconnect structure. The interconnect structure may include an $M_x$ level 102 and an $M_{x+1}$ level 112. The $M_x$ level 102 may include an $M_x$ dielectric 104 and an $M_x$ metal 106. The $M_{x+1}$ level 112 may include an $M_{x+1}$ dielectric 114 and an $M_{x+1}$ metal 116. An $M_x$ cap dielectric 110 may be located between the $M_x$ dielectric 104 and the $M_{x+1}$ dielectric 114 and electrically insulate the $M_x$ metal 106 from the $M_{x+1}$ metal 116. In addition, the $M_x$ metal 106 and the $M_{x+1}$ metal 116 may each have an $M_x$ liner 108 and an $M_{x+1}$ liner 118 separating any conductive material from the $M_x$ dielectric 104 and the $M_{x+1}$ dielectric 114, respectively. An $M_{x+1}$ cap dielectric 120 may be located above the $M_{x+1}$ dielectric 114 and electrically insulate the $M_{x+1}$ level 112 from additional interconnect levels (not shown) that may be subsequently formed above. Furthermore, a via 122 may extend vertically and form a conductive link between the $M_x$ metal 106 and the $M_{x+1}$ metal 116.

Figure 1A:
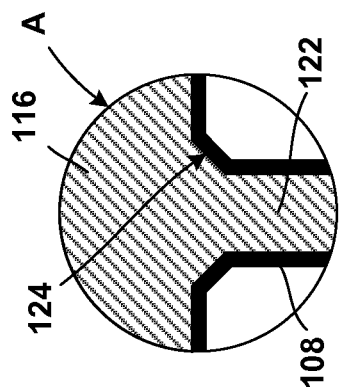
FIG. 1A depicts a section view, section A, of FIG. 1.

Now referring to FIG. 1A, a section view, section A, of FIG. 1 is shown. A chamfer feature 124 may be a characteristic of the typical processing techniques used to fabricate the present interconnect structure. The chamfer feature 124 may be located at the intersection of the via 122 and the $M_{x+1}$ metal 116, as depicted in the figures. Designed intentionally, the chamfer feature 124 may allow for the $M_{x+1}$ liner 118 to evenly cover the inner surfaces of the via 122 and the $M_{x+1}$ metal 116 prior to filling them with a conductive interconnect material. Sufficient liner coverage may be essential to obtaining a defect free structure, for example a structure without voids in the conductive material. Defects in the conductive interconnect material may negatively impact structure performance and reliability. Therefore, the chamfer feature 124 may advantageously improve interconnect performance and reliability by working to reduce or eliminate potential defects formed during fabrication.

In contrast, the e-fuse structure of the present embodiment may alternatively reverse, or eliminate, the advantages witnessed by the chamfer feature 124 described above with reference to FIG. 1. The e-fuse structure may be designed to be programmed in accordance with the application of a suitable electrical current. For example, an electrical current may be provided through the e-fuse to eventually cause the e-fuse to blow and create an open circuit. Programming refers to blowing an e-fuse and creating the open circuit. A suitable electrical current depends on the e-fuse design and may range from about 10 mA to about 25 mA, and ranges there between. Alternatively, programming may occur at a threshold current density. For example, a typical current density of 100 A/$\mu$m$^3$ may be required to program the e-fuse. Additionally, a circuit is considered to be programmed, and open, when the e-fuse resistance increases more then an order of magnitude over the initial pre-programmed resistance of the e-fuse. In some cases, programming an e-fuse structure may require a high programming current and a long programming time, both of which may negatively affect performance and reliability.

Ideally, low programming currents and short programming times are preferable when programming an e-fuse. One way to achieve lower programming currents and shorter programming times may include introducing a defective region by which may improve electromigration, and thereby encourage faster e-fuse programming at lower currents. One embodiment by which to improve e-fuse programming by introducing a defective region is described in detail below by referring to the accompanying drawings FIGS. 2-8. In the present embodiment, an intermediate dielectric positioned in a fuse region may be used to form nearly perpendicular geometry and thereby cause the formation of a defective region.

Referring now to FIG. 2, a structure 200 is shown. The structure 200 may include an $M_x$ level 202. The $M_x$ level 202 may include an $M_x$ dielectric 204, a first $M_x$ metal 206, a second $M_x$ metal 208, and an $M_x$ cap dielectric 212. The $M_x$ level 202 may be any interconnect level in the structure 200. The $M_x$ dielectric 204 may include any suitable dielectric material, for example, silicon oxide ($SiO_2$), silicon nitride ($Si_3N_4$), hydrogenated silicon carbon oxide (SiCOH), silicon based low-k dielectrics, or porous dielectrics. Known suitable deposition techniques, such as, for example, atomic layer deposition, chemical vapor deposition, plasma enhanced chemical vapor deposition, spin on deposition, or physical vapor deposition may be used to form the $M_x$ dielectric 204. The $M_x$ dielectric 204 may have a typical thickness ranging from about 100 nm to about 150 nm and ranges there between, although a thickness less than 100 nm and greater than 150 nm may be acceptable. It should be noted that while only a single interconnect level is shown, the structure 200 may have multiple interconnect levels above and below the $M_x$ level 202. It should also be noted that the left side of FIG. 2 is intended to depict a non-fuse region of the structure 200, and the right side of FIG. 2 is intended to depict a fuse region of the structure 200.

The first $M_x$ metal 206 and the second $M_x$ metal 208 may be formed in the $M_x$ dielectric 204 in accordance with typical lithography techniques. The first $M_x$ metal 206 may consist of a typical line or wire found in a typical semiconductor circuit and the second $M_x$ metal 208 may consist of a typical line or wire which will form the base structure for an e-fuse. The first $M_x$ metal 206 and the second $M_x$ metal 208 may be substantially similar structures and may be fabricated using, for example, a typical single or dual damascene technique in which a conductive interconnect material may be deposited in a trench formed in the $M_x$ dielectric 204.

In one embodiment, the first $M_x$ metal 206 and the second $M_x$ metal 208 may include various barrier liners, for example, an $M_x$ liner 210. The $M_x$ liner 210 may include, for example, tantalum nitride (TaN), followed by an additional layer including tantalum (Ta). Other barrier liners may include cobalt (Co), or ruthenium (Ru) either alone or in combination with any other suitable liner. The conductive interconnect material may include, for example, copper (Cu), aluminum (Al), or tungsten (W). The conductive interconnect material may be formed using a filling technique such as electroplating, electroless plating, chemical vapor deposition, physical vapor deposition or a combination of methods. The conductive interconnect material may alternatively include a dopant, such as, for example, manganese (Mn), magnesium (Mg), copper (Cu), aluminum (Al) or other known dopants. A seed layer (not shown) may optionally be deposited using any suitable deposition technique, for example chemical vapor deposition or physical vapor deposition, prior to filling the trench. The seed layer may also include similar dopants as the conductive interconnect material.

With continued reference to FIG. 2, the $M_x$ cap dielectric 212 may be deposited over the structure 200. The $M_x$ cap dielectric 212 may electrically insulate the $M_x$ level 202 from additional interconnect levels (not shown) that may be subsequently formed above the $M_x$ level 202. The $M_x$ cap dielectric 212 may be deposited using typical deposition techniques, for example, chemical vapor deposition. The $M_x$ cap dielectric 212 may include, for example, silicon nitride ($Si_3N_4$), silicon carbide (SiC), silicon carbon nitride (SiCN), hydrogenated silicon carbide (SiCH), or other known capping materials. The $M_x$ cap dielectric 212 may have a thickness ranging from about 20 nm to about 60 nm and ranges there between, although a thickness less than 20 nm and greater than 60 nm may be acceptable.

Referring now to FIG. 3, an $M_{x+1}$ level 214 may be formed above the $M_x$ level 202. At this step, the $M_{x+1}$ level 214 may include a first $M_{x+1}$ dielectric 216 and an intermediate dielectric 218. Like the $M_x$ level 202, the $M_{x+1}$ level 214 may be any interconnect level in the structure 200. The first $M_{x+1}$ dielectric 216 may include similar materials and may be formed by a similar process as the $M_x$ dielectric 204 described above. However, the first $M_{x+1}$ dielectric 216 may have a thickness ($H_1$) less than the thickness of the $M_x$ dielectric 204. For example, the first $M_{x+1}$ dielectric 216 may have a thickness ($H_1$) ranging from about 75 nm to about 100 nm and ranges there between, although a thickness less than 75 nm and greater than 100 nm may be acceptable. The intermediate dielectric 218 may include similar materials and may be formed by a similar process as the $M_x$ cap dielectric 212 described above. The intermediate dielectric 218 may have a thickness equal to or less than that of the $M_x$ cap dielectric 212.

Referring now to FIG. 4, some of the intermediate dielectric 218 may be removed using known typical lithography and masking techniques. For example, a hardmask may be applied and a suitable etching technique may be used to remove the unwanted portions. In one embodiment, the intermediate dielectric 218 (FIG. 4) may include silicon nitride (SiN) and a dry etching technique using a fluorine and oxygen based etchant may be used to remove a portion of the intermediate dielectric 218. A remaining intermediate dielectric 220 may be located in the fuse region of the structure 200 as depicted. It should be noted that the specific position of the remaining intermediate dielectric 220 within the fuse region of the structure 200 may dictate the position of subsequently formed features.

Referring now to FIG. 5, a second $M_{x+1}$ dielectric 222 may be formed on top of the first $M_{x+1}$ dielectric 216 and the remaining intermediate dielectric 220. The second $M_{x+1}$ dielectric 222 may also be included in the $M_{x+1}$ level 214. The second $M_{x+1}$ dielectric 222 may include similar materials and may be formed by a similar process as the $M_x$ dielectric 204 described above. Like the first $M_{x+1}$ dielectric 216, the second $M_{x+1}$ dielectric 222 may have a thickness ($H_2$) less than the thickness of the $M_x$ dielectric 204. For example, the second $M_{x+1}$ dielectric 222 may have a thickness ($H_2$) ranging from about 25 nm to about 50 nm and ranges there between, although a thickness less than 25 nm and greater than 50 nm may be acceptable. The total thickness ($H_3$) of both the first and second $M_{x+1}$ dielectrics 216, 222, may be substantially equal to the thickness of the $M_x$ dielectric 204.

Referring now to FIG. 6, a non-fuse trench 224 and a fuse trench 226 may be formed in the non-fuse region and the fuse region of the structure 200, respectfully. Both the non-fuse trench 224 and the fuse trench 226 may be formed using any suitable masking and etching technique known in the art. In one embodiment, a particular etching technique having highly selective chemistry may be chosen to etch the first $M_{x+1}$ dielectric 216 and the second $M_{x+1}$ dielectric 222. For example, a dry etching technique using a fluorine based etchant may be used. In one embodiment, for example, a very selective etchant chemistry such as $C_4F_8$ may be used to form the non-fuse trench 224 and the fuse trench 226.

The selectivity of the etching technique may refer to a difference between the etch rates of two material relative to the same etching technique. For example, when using a $C_4F_8$ etchant in the present embodiment, the etch rate of the first $M_{x+1}$ dielectric 216 and the second $M_{x+1}$ dielectric 222 may be greater than the etch rate of the remaining intermediate dielectric 220. Therefore, due to the difference in the etch rates the first $M_{x+1}$ dielectric 216 and the second $M_{x+1}$ dielectric 222 may etch significantly faster than the remaining intermediate dielectric 220, and thus cause the fuse trench 226 to have multiple depths, as depicted in FIG. 6.

The non-fuse trench 224 may have a single, nearly uniform, depth ($D_1$), and the fuse trench 226 may have at least two different depths ($D_2$, $D_3$). In one embodiment, the depth ($D_1$) of the non-fuse trench 224 may be substantially equal to the depth ($D_2$) of the fuse trench 226. Furthermore, in one embodiment, the depth ($D_2$) may be greater than the depth ($D_3$), both of the fuse trench 226. Therefore, the portion of the fuse trench 226 having the depth ($D_3$) may be referred to as a thin portion. In a preferred embodiment, the depth ($D_3$) may be about half of the depth ($D_2$). In one embodiment, the depth ($D_1$) and the depth ($D_2$) may range from about 50 nm to about 100 nm, and the depth ($D_3$) may range from about 25 nm to about 50 nm.

The two different depths of the fuse trench 226 may be created due to the presence of the remaining intermediate dielectric 220. Because of the etch chemistry selectivity, the remaining intermediate dielectric 220 may effectively function as an etch stop, and prevent the etching of a portion of the fuse trench 226. In one embodiment, the fuse trench may be wider than the remaining intermediate dielectric 220, and therefore a portion on either side of the remaining intermediate dielectric 220 may be etched deeper than a middle portion, or thin portion, as shown in the figure.

Now referring to FIG. 6A, a section view, section B, of FIG. 6 is shown. An undercut feature 228 may be produced during the formation of the fuse trench 226. The presence of the remaining intermediate dielectric 220 may create a nearly perpendicular geometry in the first $M_{x+1}$ dielectric 216, and induce the formation of the undercut feature 228. The undercut feature 228 may be formed by the etching technique used to form the fuse trench 226. The undercut feature 228 may be contrasted with the chamfer feature 124 shown in FIG. 1. A chamfer feature like the chamfer feature 124 in FIG. 1, may be produced in the absence of the remaining intermediate dielectric 220. Because of the remaining intermediate dielectric 220, the undercut feature 228 may be formed instead of the chamfer feature 124 shown in FIG. 1.

Referring now to FIG. 7, a first via opening 230 and a second via opening 232 may be formed in the first $M_{x+1}$ dielectric 216. The first via opening 230 may be formed at the bottom of the non-fuse trench 224 (FIG. 6) in the non-fuse region of the structure 200. The second via opening 232 may be formed at the bottom of the fuse trench 226 (FIG. 6) in the fuse region of the structure 200. Both the first via opening 230 and the second via opening 232 may be formed using any suitable masking and etching technique known in the art, and may include one or more etching steps. First, in one embodiment, a particular etching technique having highly selective chemistry may be chosen to etch the first via opening 230 and the second via opening 232 in the first $M_{x+1}$ dielectric 216. For example, a dry etching technique using a fluorine based etchant may be used. In one embodiment, for example, a very selective etchant chemistry such as $C_4F_8$ may be used to etch both the first and second via openings 230, 232 in the first $M_{x+1}$ dielectric 216; however, the remaining intermediate dielectric 220 and a portion of the $M_x$ cap dielectric 212 located at the bottom of the via openings may remain because of the selectivity of the chosen etching technique. The selectivity of the etching technique may be similar to the selectivity previously described with reference to the formation of the non-fuse trench 224 and the fuse trench 226, shown in FIG. 6.

Second, in one embodiment, a particular etching technique having poor selectivity may be chosen to finish etching the first via opening 230 and the second via opening 232, and further remove the portion of the $M_x$ cap dielectric 212 at the bottom of the via openings (230, 232). The remaining intermediate dielectric 220 may also be removed during this second etching step. In one embodiment, a dry etching technique using a fluorine based etchant, for example a $CHF_3$ etchant mixed with oxygen, may be used to finish etching the via openings (230, 232) and remove the remaining intermediate dielectric 220. The second etching step may cause the undercut feature 228 to grow larger, as depicted in the section view, section C, shown in FIG. 7A. Preferably, the first via opening 230 may extend from the bottom of the non-fuse trench 224 to the first $M_x$ metal 206, and similarly, the second via opening 232 may extend from the bottom of the fuse trench 226 to the second $M_x$ metal 208.

In one embodiment, the intermediate dielectric 220 and the selectivity of the corresponding etching technique may partially block via formation, and result in an undersized via opening in the fuse region of the structure 200. In such cases the resulting via located in the fuse region may be about 30% to about 80% the size of a via in the non-fuse region of the structure 200. The undersized via may effectively lower the required programming current.

Figure 8:
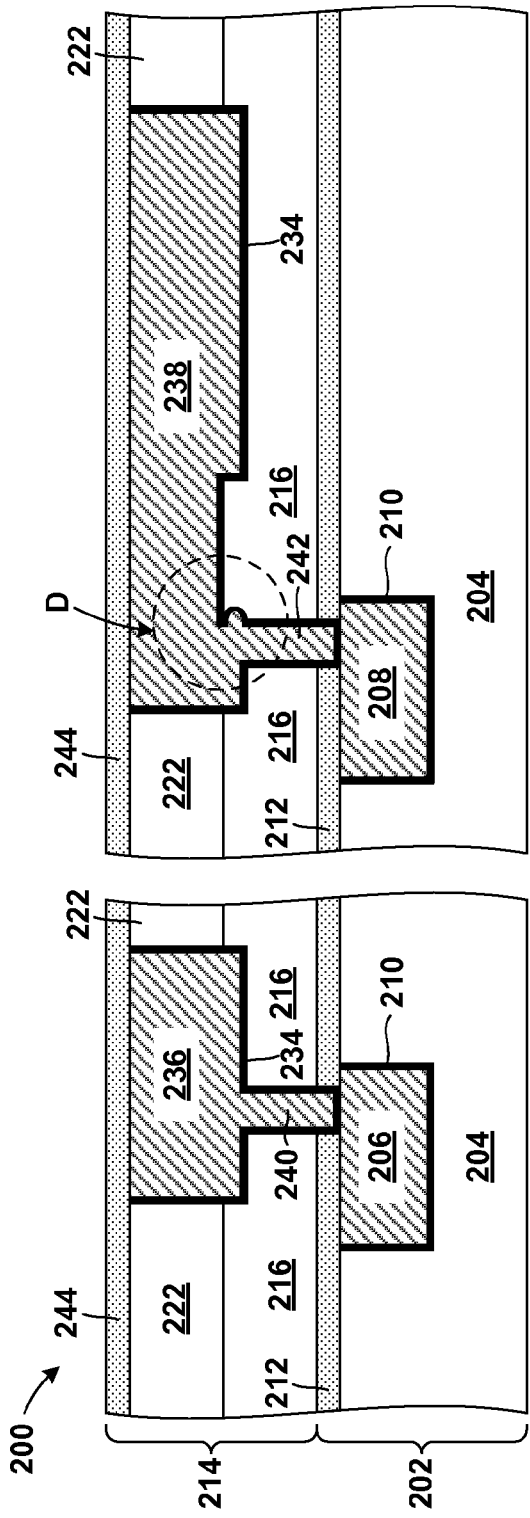

Referring now to FIG. 8, the non-fuse trench 224 (FIG. 6), the fuse trench 226 (FIG. 6), the first via opening 230 (FIG. 7), and the second via opening 232 (FIG. 7) may be filled with a conductive interconnect material to form a first $M_{x+1}$ metal 236, a second $M_{x+1}$ metal 238, a first via 240, and a second via 242. The conductive interconnect material used to form the first $M_{x+1}$ metal 236, the second $M_{x+1}$ metal 238, the first via 240, and the second via 242 may be substantially similar to that described above with reference to FIG. 2. In one embodiment, the first $M_{x+1}$ metal 236, the second $M_{x+1}$ metal 238, the first via 240, and the second via 242 may include various barrier liners, for example, an $M_{x+1}$ liner 234. The $M_{x+1}$ liner 234 may be substantially similar to the $M_x$ liner 210 described above with reference to FIG. 2. Furthermore, a seed layer (not shown) may optionally be deposited, as described above, prior to filling the trenches and vias with the conductive interconnect material. After filling the non-fuse trench 224 (FIG. 6), the fuse trench 226 (FIG. 6), the first via opening 230 (FIG. 7), and the second via opening 232 (FIG. 7) with the conductive interconnect material an $M_{x+1}$ cap dielectric 244 may be deposited on top of the structure 200. A chemical mechanical polishing technique may be applied to ensure complete removal of excess conductive interconnect material prior to depositing the $M_{x+1}$ cap dielectric 244. The $M_{x+1}$ cap dielectric 244 may be substantially similar to the $M_x$ cap dielectric 212 described above with reference to FIG. 2.

Vias, generally, may be used to form electrical connections between the metallization of two interconnect levels. The first via 240 may extend vertically and form a conductive link between the first $M_x$ metal 206 and the first $M_{x+1}$ metal 236. The second via 242 may extend vertically and form a conductive link between second $M_x$ metal 208 and the second $M_{x+1}$ metal 238. The first and second vias 240, 242 may have an aspect ratio of about 4:1 or more, and a diameter or width ranging from about 10 nm to about 50 nm and ranges there between, although a via diameter less than 10 nm and greater than 50 nm may be acceptable.

Figure 8A:
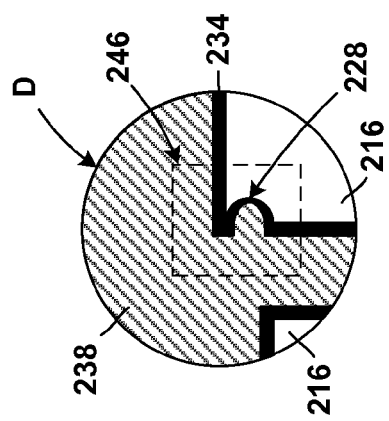
FIG. 8A depicts a section view, section D, of FIG. 8.

The presence of the undercut feature 228 may result in a damaged region 246 depicted in the section view, section D, shown in FIG. 8A. The damaged region 246 may include the undercut feature 228. In one embodiment, the damage region 246 may include poor liner coverage and poor seed layer coverage near the undercut feature 228. The poor liner coverage and the poor seed layer coverage may be caused by the unique geometry of the undercut feature 228. Poor liner coverage and poor seed layer coverage may include non-uniform thickness, incomplete coverage, or even small voids in the liner or the seed layer. The small voids in the seed layer, specifically, may be susceptible to electromigration which may grow under an applicable flow of current and other factors such as high current density and heat.

With continued reference to FIGS. 8 and 8A, the final e-fuse structure is shown. The left side of FIG. 8 represents a non-fuse structure, while the right side of FIG. 8 represents the e-fuse structure. Therefore, the second $M_x$ metal 208, the second via 242, and the second $M_{x+1}$ metal 238 may together form the e-fuse structure.

Figure 9:
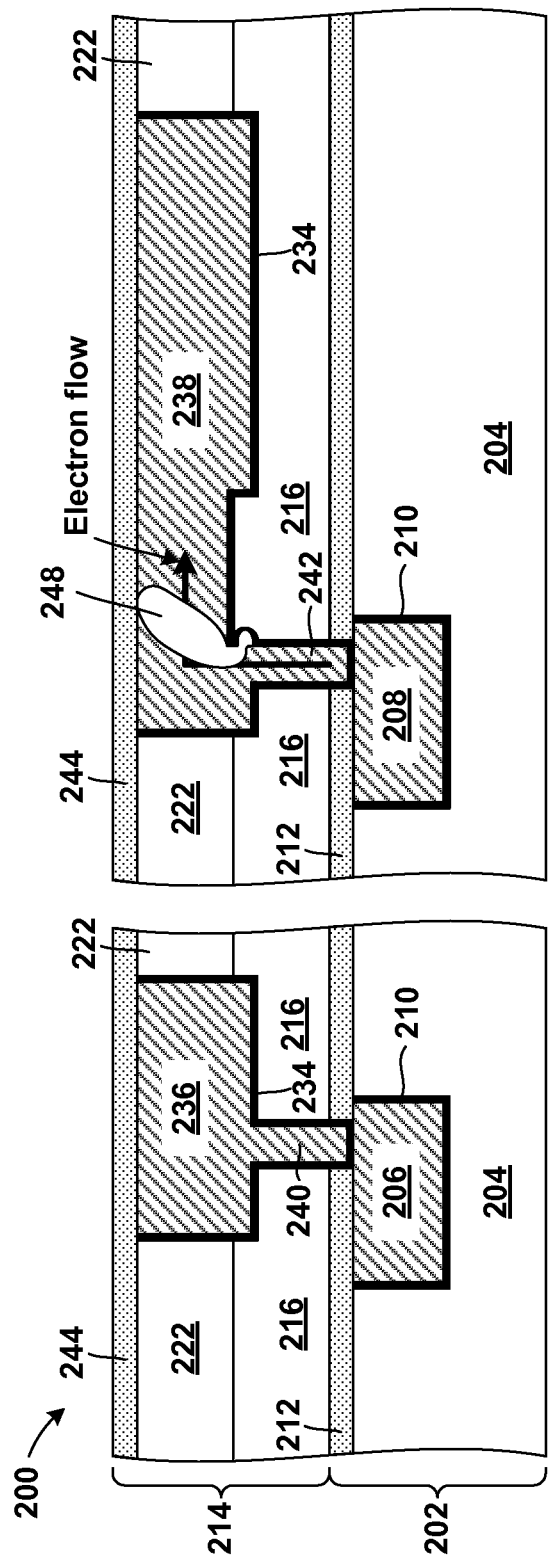
FIG. 9 depicts the final e-fuse structure after programming according to an exemplary embodiment.

Referring now to FIG. 9, the final e-fuse structure is shown after programming. The thin region of the second $M_{x+1}$ metal 238 may cause higher resistance and result in localized heating of the metal. The damaged region 246 (FIG. 8A), including small voids in the seed layer, may further be susceptible to electromigration and result in the formation of a large void 248. The large void 248 may begin to grow from the damaged region 246 (FIG. 8A) as the conductive interconnect material migrates in the direction of the current. This configuration may provide more consistency and reliability during programming of the e-fuse because the large void 248, or open circuit, may occur at lower programming currents and shorter programming times. The lower programming currents and shorter programming times may be achieved by the introduction of the damaged region 246 (FIG. 8A). The damaged region 246 (FIG. 8A) may improve electromigration, and thereby encouraging faster e-fuse programming at lower currents.

Figure 10:
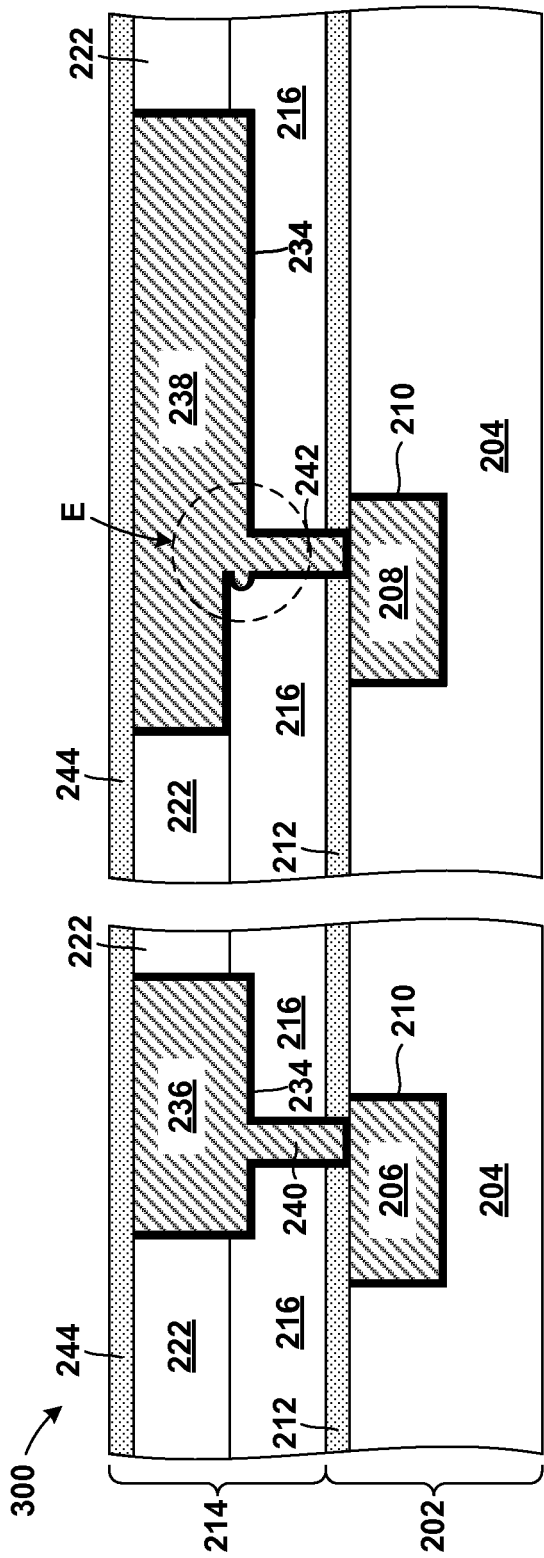
FIG. 10 depicts the final e-fuse structure according to another exemplary embodiment.
Figure 10A:
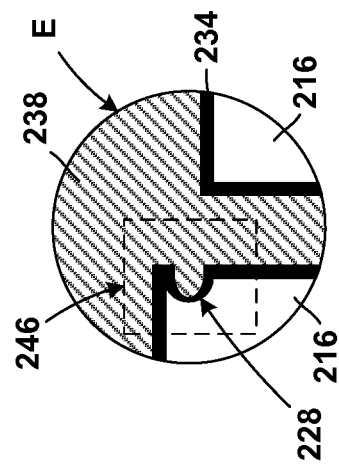
FIG. 10A depicts a section view, section E, of FIG. 10.

Now referring to FIGS. 10 and 10A, an alternate final e-fuse structure 300 is shown according to another embodiment. The Structure 300 may have a single defective region 246 similar to the structure 200 described above; however the thin portion of the second $M_{x+1}$ metal 238 may be positioned at one end of the fuse trench 226 (FIG. 6), as shown in the figure. Like above, an intersection having nearly perpendicular geometry may produce the undercut feature 228, as shown in FIG. 10A. Also like above, the undercut feature 228 may result in a defective region, for example the defective region 246. Process steps similar to those described in detail above, may be applied to achieve the present embodiment shown in FIGS. 10 and 10A.

Now referring to FIGS. 11 and 11A, an alternate final e-fuse structure 400 is shown according to another embodiment. The structure 400 may have two defective regions 246 unlike the structure 200 described above, and the second via 242 may be positioned beneath, rather than adjacent, the thin portion of the second $M_{x+1}$ metal 238. Doing so may create two intersections having nearly perpendicular geometry during fabrication. As described in detail above, the nearly perpendicular geometry may produce the undercut feature 228, like above; however in the present embodiment the structure 400 may have more than one undercut feature 228 as depicted in FIG. 11A. The undercut features 228 of the structure 400 may result in more than one defective region, for example the defective regions 246. Process steps similar to those described in detail above, may be applied to achieve the present embodiment shown in FIGS. 11 and 11A.

Another embodiment by which to improve e-fuse programming by introducing a defective region is described in detail below by referring to the accompanying drawings FIGS. 12-18. In the present embodiment, multiple metallization structures of a single interconnect level are arraigned in such a configuration to form nearly perpendicular geometry similar to that described above, and thereby cause the formation of a defective region.

Figure 12:
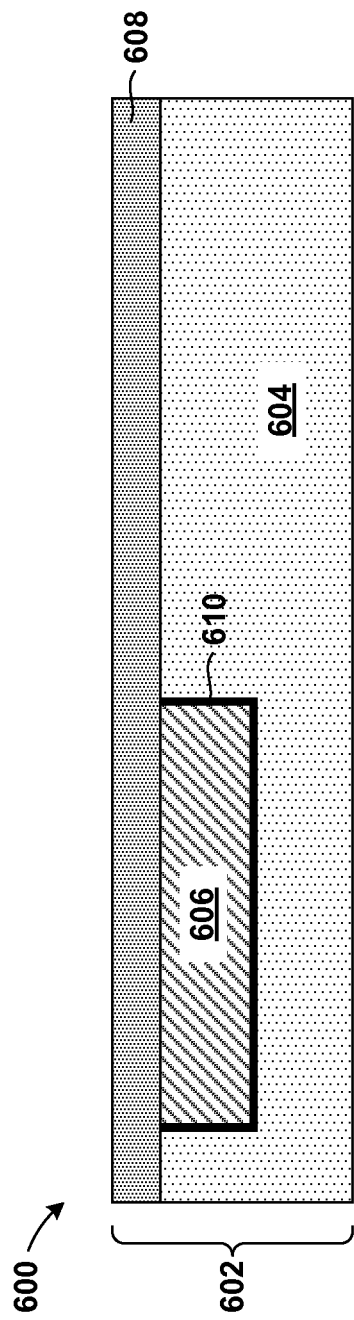

Referring now to FIG. 12, an $M_x$ level 602 is shown. The $M_x$ level 602 may include an $M_x$ dielectric 604, an $M_x$ metal 606, and an $M_x$ cap dielectric 608. The $M_x$ level 602 may be any interconnect level in the structure 600. The $M_x$ dielectric 604 may include any suitable dielectric material, for example, silicon oxide ($SiO_2$), silicon nitride ($Si_3N_4$), hydrogenated silicon carbon oxide (SiCOH), silicon based low-k dielectrics, or porous dielectrics. Known suitable deposition techniques, such as, for example, atomic layer deposition, chemical vapor deposition, or physical vapor deposition may be used to form the $M_x$ dielectric 604. The $M_x$ dielectric 604 may have a typical thickness ranging from about 100 nm to about 150 nm and ranges there between, although a thickness less than 100 nm and greater than 150 nm may be acceptable. It should be noted that while only a single interconnect level is shown, the structure 600 may have multiple interconnect levels above and below the $M_x$ level 602. It should also be noted that FIG. 12, and subsequent figures, are intended to depict a fuse region of the structure 600, which may be understood by a person having ordinary skill in the art to be separate and apart from a non-fuse region.

The $M_x$ metal 606 may be formed in the $M_x$ dielectric 604 in accordance with typical techniques. The $M_x$ metal 606 may consist of a typical line or wire found in a typical semiconductor circuit and may subsequently form the base structure for an e-fuse. The $M_x$ metal 606 may be fabricated using, for example, a typical single or dual damascene technique in which a conductive interconnect material may be deposited in a trench formed in the $M_x$ dielectric 604.

In one embodiment, the $M_x$ metal 606 may include various barrier liners, for example, an $M_x$ liner 610. The $M_x$ liner 610 may include, for example, tantalum nitride (TaN), followed by an additional layer including tantalum (Ta). Other barrier liners may include cobalt (Co), or ruthenium (Ru) either alone or in combination with any other suitable liner. The conductive interconnect material may include, for example, copper (Cu), aluminum (Al), or tungsten (W). The conductive interconnect material may be formed using a filling technique such as electroplating, electroless plating, chemical vapor deposition, physical vapor deposition or a combination of methods. The conductive interconnect material may alternatively include a dopant, such as, for example, manganese (Mn), magnesium (Mg), copper (Cu), aluminum (Al) or other known dopants. A seed layer (not shown) may optionally be deposited using any suitable deposition technique, for example chemical vapor deposition or physical vapor deposition, prior to filling the trench. The seed layer may also include similar dopants as the conductive interconnect material.

With continued reference to FIG. 12, the $M_x$ cap dielectric 608 may be deposited over the structure 600. The $M_x$ cap dielectric 608 may electrically insulate the $M_x$ level 602 from additional interconnect levels (not shown) that may be subsequently formed above the $M_x$ level 602. The $M_x$ cap dielectric 608 may be deposited using typical deposition techniques, for example, chemical vapor deposition. The $M_x$ cap dielectric 608 may include, for example, silicon nitride ($Si_3N_4$), silicon carbide (SiC), silicon carbon nitride (SiCN), hydrogenated silicon carbide (SiCH), or other known capping materials. The $M_x$ cap dielectric 608 may have a thickness ranging from about 20 nm to about 60 nm and ranges there between, although a thickness less than 20 nm and greater than 60 nm may be acceptable.

Referring now to FIG. 13, a top view of a design layout 700 is shown. The design layout 700 may consist of a pattern which may be reproduced using a lithography technique. Typically, the design layout 700 may be implemented in the form of a computer program or computer file which may subsequently be read by a piece of lithography equipment. Optical proximity correction (OPC) is a photolithography enhancement technique commonly used to compensate for image errors due to diffraction or process effects. A design layout, such as the design layout 700 may undergo optical proximity correction prior to being inputted and read by the lithography equipment. In some cases, optical proximity correction may be an integrated feature of the lithography equipment. A person of ordinary skill in the art may be familiar with the lithography process and optical proximity correction.

The design layout 700 may include a layout of four features, generally, three minimum ground rule lines parallel with one another and extending from a single edge of a larger feature. Minimum ground rule limitations may also apply to the line spacing. For example, if the minimum ground rule is 32 nm, then the width of the line features may be designed at 32 nm and the spacing between the line features may also be designed to be 32 nm. The three line features may not have a preferred length, however, a length ranging from about 0.5 um to about 50 um may be used. As will be described in detail below, the middle line will form the base structure for an electronic fuse while each line on either side of the middle line may be a dummy line and not used to form interconnects. The four features of the design layout 700 may ultimately be etched into the surface of a dielectric material and filled with a conductive interconnect material to form the metallization of a single interconnect level.

Now referring to FIGS. 14, 15, and 16 the structure 600 is shown depicting the final pattern after patterning the design layout 700 (FIG. 13) into an $M_{x+1}$ level 612. It should be noted that while the $M_{x+1}$ level 612 may preferably be formed above the $M_x$ level 602, the $M_x$ level 602 is omitted from FIGS. 14, 15, and 16 for illustrative purposes only. At this stage of the fabrication, the $M_{x+1}$ level 612 may include an $M_{x+1}$ dielectric 614 which may be substantially similar in all respects to the $M_x$ dielectric 604 described above. It should also be noted that FIG. 14 is a top view of the structure 600, while FIG. 15 and FIG. 16 are cross section views, section A-A and section B-B, of the top view in FIG. 14, respectively. Like the $M_x$ level 602, the $M_{x+1}$ level 612 may be any interconnect level in the structure 600.

Patterning of the design layout 700 (FIG. 13) in the $M_{x+1}$ level 612 may result in the formation of a first trench 616, a second trench 618, a third trench 620, and a fourth trench 622. The first, second, third, and fourth trenches 616, 618, 620, 622 may be formed using any suitable masking and etching technique known in the art. The second, third, and fourth trenches 618, 620, 622 may represent the three parallel minimum ground rule lines of the design layout 700 (FIG. 13), and the first trench 616 may represent the larger feature of the design layout 700 (FIG. 13). Generally, the first, second, third, and fourth trenches 616, 618, 620, 622 may be substantially similar in size and shape to the design layout 700 of FIG. 13; however, the optical proximity correction technique described above may be needed to achieve such results.

A dry etching technique using a fluorine based etchant may be used to form the first, second, third, and fourth trenches 616, 618, 620, 622. In one embodiment, for example, an etchant chemistry such as $C_xF_y$ may be used to form the first, second, third, and fourth trenches 616, 618, 620, 622. In another embodiment, reactive ion etching may be used to form the first, second, third, and fourth trenches 616, 618, 620, 622. The first, second, third, and fourth trenches 616, 618, 620, 622 may have a single, nearly uniform, depth ($D_1$), except for a localized region where the third trench 620 intersects with the first trench 616. This region may be referred to as a necked region 624 as depicted in the figures. The necked region 624 may have a depth ($D_2$) less than the nominal depth ($D_1$) of the first, second, third, and fourth trenches 616, 618, 620, 622. In one embodiment, the depth ($D_2$) may be about 50% to about 75% of the depth ($D_1$).

Furthermore, the second, third, and fourth trenches 618, 620, 622 may have a single, nearly uniform, width ($W_1$), except for the necked region 624 of the third trench 620. The necked region 624 may have a width ($W_2$) less than the nominal width ($W_1$) of the second, third, and fourth trenches 618, 620, 622. In one embodiment, the width ($W_2$) may be about 50% to about 75% of the width ($W_1$). Generally, the size of the second, third, and fourth trenches 618, 620, 622 may be limited by current ground-rule limitations, and the necked region 624 may have sub ground-rule dimensions in which the depth ($D_2$) and the width ($W_2$) are both sub-ground rule. For example, if the minimum ground rule is 32 nm, then the width of the second, third, and fourth trenches 618, 620, 622 may be about 32 nm and the spacing between the second, third, and fourth trenches 618, 620, 622 may also be about 32 nm. Furthermore, both the width ($W_2$) and the depth ($D_2$) of the necked region 624 may be less than 32 nm. Historically, the ground-rules decrease with each technology node, and one skilled in the art will recognize that the ground-rules may decrease over time.

The necked region 624 may be formed during the patterning of the first, second, third, and fourth trenches 616, 618, 620, 622. A sub-ground rule feature, for example the necked region 624, may be due in part to the configuration of the first, second, third, and fourth trenches 616, 618, 620, 622. The optical proximity correction of the design layout 700 of FIG. 13 may be limited by the minimum ground-rule configuration of the three parallel lines. Therefore, the optical proximity correction may be unable to compensate for the dense pattern and may result in the formation of the necked region 624. Because the necked region 624 is a desired feature of the structure 600, the first and third trenches 616, 620 may be included in the design layout 700 (FIG. 13) simply to induce the formation of the necked region 624. Furthermore, the relationship between the first trench 616 and the second, third, and fourth trenches 618, 620, 622 of the design layout 700 may be intentionally configured to produce the necked region 624. The second and fourth trenches 618, 622 may alternatively be referred to as dummy features as they may serve no other purpose than to induce the formation of the necked region 624. It should be noted that any other design layout configuration having minimum ground-rule spacing between features may also produce a similar necked region.

Referring now to FIG. 17, the $M_{x+1}$ level 612 and the $M_x$ level 602 are shown one on top of the other. Next, a via opening 626 may be formed in the $M_{x+1}$ dielectric 614. The via opening 626 may be formed at the bottom of the first trench 616 of the structure 600 adjacent to the necked region 624. The via opening 626 may be formed using any suitable masking and etching technique known in the art, and may include multiple etching steps. First, in one embodiment, a particular etching technique having selective chemistry may be chosen to etch the via opening 626 in the $M_{x+1}$ dielectric 614. For example, a dry etching technique using a fluorine based etchant may be used. In one embodiment, for example, a very selective etchant chemistry such as $C_4F_8$ may be used to etch the via opening 626 in the $M_{x+1}$ dielectric 614; however, a portion of the $M_x$ cap dielectric 608 located at the bottom of the via opening 626 may remain because of the selectivity of the chosen etching technique.

Second, in one embodiment, a particular etching technique having poor selectivity may be chosen to finish etching the via opening 626, and further remove the portion of the $M_x$ cap dielectric 608 at the bottom of the via opening 626. In one embodiment, a dry etching technique using a fluorine based etchant, for example a $CHF_3$ etchant mixed with oxygen, may be used to finish etching the via opening 626.

Now referring to FIG. 17A, a section view, section G, of FIG. 17 is shown. An undercut feature 628 may be produced during the formation of the via opening 626. Because of a mask used to locate the via opening 626, the undercut feature 628 may be formed instead of the chamfer feature 124 shown in FIG. 1A. The undercut feature 628 may be contrasted with the chamfer feature 124 shown in FIG. 1A. Preferably, the via opening 626 may extend from the bottom of the first trench 616 to the $M_x$ metal 606.

Referring now to FIG. 18, the first trench 616 (FIG. 17), the second trench 618 (FIG. 14), the third trench 620 (FIG. 17), the fourth trench 622 (FIG. 14), and the via opening 626 (FIG. 17) may be filled with a conductive interconnect material to form a first $M_{x+1}$ metal 632, a second $M_{x+1}$ metal (not shown), a third $M_{x+1}$ metal 634, a fourth $M_{x+1}$ metal (not shown), and a via 636. The conductive interconnect material used to form the first and third $M_{x+1}$ metals 632, 634, and the via 636 may be substantially similar to that described above with reference to FIG. 12. In one embodiment, the first and third $M_{x+1}$ metals 632, 634, and the via 636 may include various barrier liners, for example, an $M_{x+1}$ liner 630. The $M_{x+1}$ liner 630 may be substantially similar to the $M_x$ liner 610 described above with reference to FIG. 12. Furthermore, a seed layer (not shown) may optionally be deposited, as described above, prior to filling the trenches and vias with the conductive interconnect material. After filling the first trench 616 (FIG. 17), the second trench 618 (FIG. 14), the third trench 620 (FIG. 17), the fourth trench 622 (FIG. 14), and the via opening 626 (FIG. 17) with the conductive interconnect material, an $M_{x+1}$ cap dielectric 638 may be deposited on top of the structure 600. The $M_{x+1}$ cap dielectric 638 may be substantially similar to the $M_x$ cap dielectric 608 described above with reference to FIG. 12.

Vias, generally, may be used to form electrical connections between the metallization of two interconnect levels. The via 636 may extend vertically and form a conductive link between the $M_x$ metal 606 and the first $M_{x+1}$ metal 632. The via 636 may have an aspect ratio of about 2:1 or more, and a diameter or width ranging from about 10 nm to about 50 nm and ranges there between, although a via diameter less than 10 nm and greater than 50 nm may be acceptable.

The presence of the undercut feature 628 may result in a damaged region 640 as depicted in the section view, section H, shown in FIG. 18A. The damaged region 640 may include the undercut feature 628. In one embodiment, the damage region 640 may include poor liner coverage and poor seed layer coverage near the undercut feature 628. The poor liner coverage and the poor seed layer coverage may be caused by the unique geometry of the undercut feature 628. Poor liner coverage and poor seed layer coverage may include non-uniform thickness, incomplete coverage, or even small voids in the liner or the seed layer. The small voids in the seed layer, specifically, may be susceptible to electromigration, which may grow under an applicable flow of current and other factors such as high current density and heat.

With continued reference to FIGS. 18 and 18A, the final e-fuse structure is shown. Therefore, the $M_x$ metal 606, the via 636, and the first $M_{x+1}$ metal 632 may together form the e-fuse structure.

Figure 19:
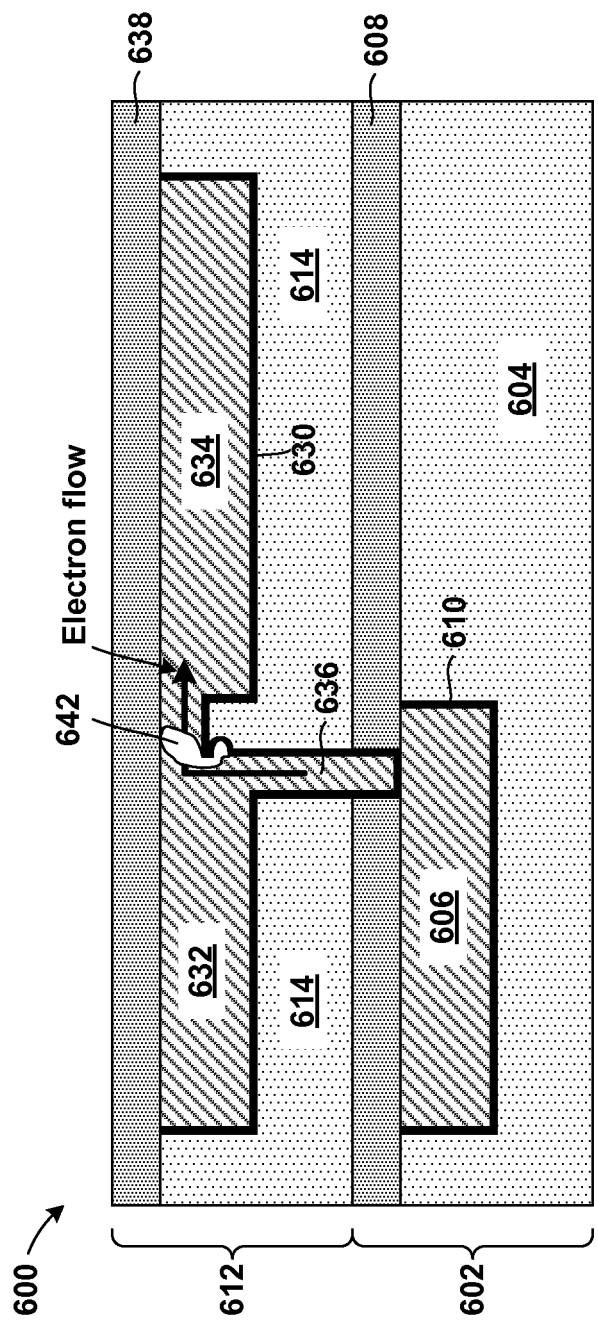
FIG. 19 depicts the final e-fuse structure after programming according to another exemplary embodiment.

Referring now to FIG. 19, the final e-fuse structure is shown after programming. The necked region 624 (FIG. 18) of the third $M_{x+1}$ metal 634 may cause higher resistance and result in higher local current density and localized heating of the metal. The damaged region 640 (FIG. 18A), including small voids in the seed layer, may further be susceptible to electromigration and result in the formation of a large void 642. The large void 642 may begin to grow from the damaged region 640 (FIG. 18A) as the conductive interconnect material migrates in the direction of the electron current. This configuration may provide more consistency and reliability during programming of the e-fuse because the large void 642, or open circuit, may occur at lower programming currents and shorter programming times. The lower programming currents and shorter programming times may be achieved by the introduction of the defective region 640 (FIG. 18A) and the localized necked region 624 (FIG. 18).

Figure 20:
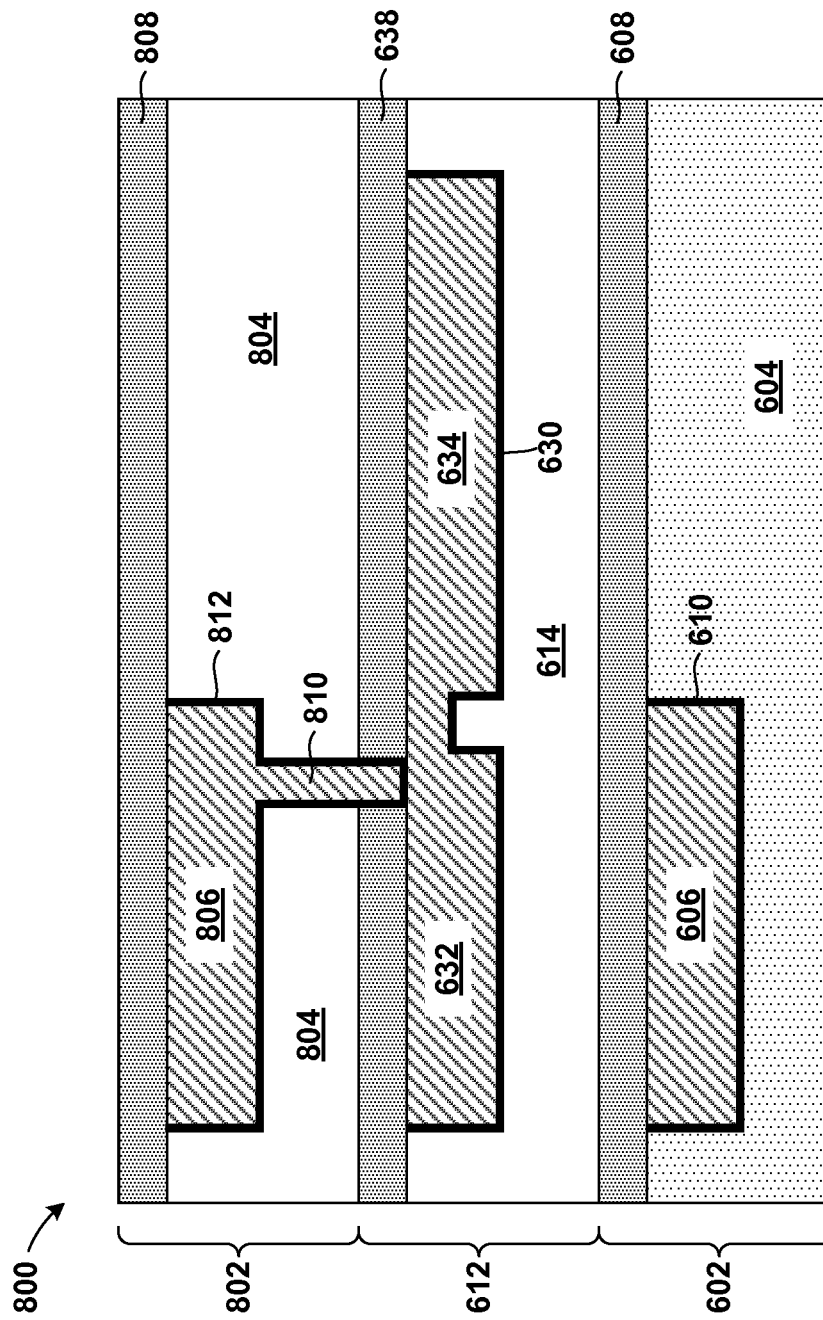
FIG. 20 depicts the final e-fuse structure according to another exemplary embodiment.

Now referring to FIG. 20, a structure 800 is shown. The structure 800 includes a final e-fuse structure according to an alternative embodiment. In the present embodiment, a via may be formed adjacent to and above the necked region of the third $M_{x+1}$ metal 634. The structure 800 may include the $M_x$ level 602 and the $M_{x+1}$ level 612, like the structure 600 described above. An $M_{x+2}$ level 802 may be positioned above the $M_{x+1}$ level 612. The $M_{x+2}$ level 802 may include an $M_{x+2}$ dielectric 804, an $M_{x+2}$ metal 806, and an $M_{x+2}$ cap dielectric 808. Like the $M_x$ level 602 and the $M_{x+1}$ level 612 described, above the $M_{x+2}$ level 802 may be any interconnect level in the structure 800. The $M_{x+2}$ dielectric 804, the $M_{x+2}$ metal 806, and the $M_{x+2}$ cap dielectric 808 may be substantially similar in all respects to the $M_x$ dielectric 604, the $M_x$ metal 606, and the $M_x$ cap dielectric 608.

The $M_{x+2}$ level 802 may further include via 810 which may extend vertically and form a conductive link between the first $M_{x+1}$ metal 632 and the $M_{x+2}$ metal 806. Like above, the $M_{x+2}$ metal 806 and the via 810 may include an $M_{x+2}$ liner 812, which may be substantially similar in all respect to the $M_x$ liner 610 described above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An electronic fuse structure comprising:
an $M_x$ level above a substrate comprising an $M_x$ metal; and
an $M_{x+1}$ level above the $M_x$ level, the $M_{x+1}$ level comprising an $M_{x+1}$ metal and a via electrically connecting the $M_x$ metal to the $M_{x+1}$ metal in a vertical orientation, wherein the $M_{x+1}$ metal comprises a thick portion and a thin portion, the $M_{x+1}$ metal and the via are made from the same conductive material, and the via is located directly beneath and extends from a bottom surface of the thin portion of the $M_{x+1}$ metal down to a top surface of the $M_x$ metal such that the via is laterally spaced apart from the thick portion of the $M_{x+1}$ metal.

2. The electronic fuse structure of claim 1, wherein a width of the thin portion of the $M_{x+1}$ metal is greater than a width of the via.

3. The electronic fuse structure of claim 1, wherein a vertical thickness of the thin portion of the $M_{x+1}$ metal is less than a vertical thickness of the thick portion of the $M_{x+1}$ metal.

4. The electronic fuse structure of claim 1, wherein the thin portion of the $M_{x+1}$ metal comprises a vertical thickness less than or equal to about 50% of a vertical thickness of the $M_{x+1}$ metal.

5. The electronic fuse structure of claim 1, wherein the thin portion of the $M_{x+1}$ metal is positioned in a middle of the $M_{x+1}$ metal and flanked on opposite sides by two thick portions of the $M_{x+1}$ metal.

6. The electronic fuse structure of claim 1, wherein an intersection between a sidewall of the via and the thin portion of the $M_{x+1}$ metal is substantially perpendicular.

7. The electronic fuse structure of claim 1, further comprising:
a defective region located on a sidewall of the via and adjacent to an intersecting corner between the via and the $M_{x+1}$ metal.

8. The electronic fuse structure of claim 1, further comprising:
an undercut feature located on a sidewall of the via immediately below an intersecting corner between the via and the thin portion of the $M_{x+1}$ metal, the undercut feature extends around the perimeter of the via.

9. The electronic fuse structure of claim 1, further comprising:
a void located in the conductive material of the via and adjacent to an intersecting corner between the via and the $M_{x+1}$ metal, wherein the void causes the-resistance of the electronic fuse structure to be greater than or equal to about 10K ohms.

10. A method of forming an electronic fuse, the method comprising:
providing an $M_x$ level including a fuse region;
forming a first $M_{x+1}$ dielectric on top of the $M_x$ level;
forming an intermediate dielectric on top of a portion of the first $M_{x+1}$ dielectric above the fuse region;
forming a second $M_{x+1}$ dielectric on top of the first $M_{x+1}$ dielectric and on top of the intermediate dielectric, wherein the first $M_{x+1}$ dielectric and the second $M_{x+1}$ dielectric together form an $M_{x+1}$ level;
etching a trench in the first and second $M_{x+1}$ dielectrics of the $M_{x+1}$ level such that the entire intermediate dielectric is exposed, the trench is formed with a thick portion and a thin portion caused by etch resistance and placement of the intermediate dielectric;
forming a via opening located directly beneath and extending from a bottom surface of the thin portion of the trench down to a top surface of an $M_x$ cap dielectric such that the via is laterally spaced apart from the thick portion of the trench; and
simultaneously removing the intermediate dielectric and a portion of the $M_x$ cap dielectric at a bottom of the via opening to expose a top surface of an $M_x$ metal.

11. The method of claim 10, further comprising:
filling the trench and the via opening with a conductive material.

12. The method of claim 10, wherein the forming the intermediate dielectric above the fuse region comprises:
depositing a layer comprising a thickness less than or equal to a thickness of the $M_x$ cap dielectric located below the first $M_{x+1}$ dielectric and above the $M_x$ level.

13. The method of claim 10, wherein the forming the intermediate dielectric above the fuse region comprises:
depositing silicon nitride ($Si_3N_4$), silicon carbide (SiC), silicon carbon nitride (SiCN), hydrogenated silicon carbide (SiCH).

14. The method of claim 10, wherein the forming the first $M_{x+1}$ dielectric on top of the $M_x$ level comprises:
depositing a layer comprising a thickness ranging from about 75 nm to about 100 nm.

15. An electronic fuse structure comprising:
a first $M_{x+1}$ metal;
a second $M_{x+1}$ metal in direct contact with and extending from the first $M_{x+1}$ metal in a first direction;
a third $M_{x+1}$ metal in direct contact with and extending from the first $M_{x+1}$ metal in the first direction, wherein the third $M_{x+1}$ metal comprises a necked region located at an intersection between the first $M_{x+1}$ metal and the third $M_{x+1}$ metal; and
a fourth $M_{x+1}$ metal in direct contact with and extending from the first $M_{x+1}$ metal in the first direction,
wherein the third $M_{x+1}$ metal is positioned between the second $M_{x+1}$ metal, and the fourth $M_{x+1}$ metal; and
wherein the second $M_{x+1}$ metal and the fourth $M_{x+1}$ metal are dummy metals.

16. The electronic fuse structure of claim 15, further comprising:
an $M_x$ metal below the first $M_{x+1}$ metal; and
a via extending vertically, wherein the via formed a conductive link between the first $M_{x+1}$ metal and the $M_x$ metal.

17. The electronic fuse structure of claim 15, further comprising:
an $M_{x+2}$ metal above the first $M_{x+1}$ metal; and
a via extending vertically, wherein the via formed a conductive link between the first $M_{x+1}$ metal and the $M_{x+2}$ metal.

18. The electronic fuse structure of claim 15, wherein the second $M_{x+1}$ metal, the third $M_{x+1}$ metal, and the fourth $M_{x+1}$ metal extend in the first direction substantially perpendicular from a common side of the first $M_{x+1}$ metal.

19. The electronic fuse structure of claim 15, wherein the second $M_{x+1}$ metal and the fourth $M_{x+1}$ metal are positioned parallel with the third $M_{x+1}$ metal.

20. The electronic fuse structure of claim 16, wherein the via is adjacent to the necked region of the third $M_{x+1}$ metal.

21. The electronic fuse structure of claim 17, wherein the via is adjacent to the necked region of the third $M_{x+1}$ metal.

22. The electronic fuse structure of claim 15, wherein the necked region of the third $M_{x+1}$ metal has sub-ground rule dimensions.

23. The electronic fuse structure of claim 15, wherein the necked region of the third $M_{x+1}$ metal is smaller in both horizontal and vertical dimensions relative to the nominal dimensions of the third $M_{x+1}$ metal.

24. The electronic fuse structure of claim 15, wherein the necked region of the third $M_{x+1}$ metal is in physical and electrical contact with the first $M_{x+1}$ metal.

* * * * *